United States Patent [19]
Chigawa et al.

[11] Patent Number: 5,926,694
[45] Date of Patent: Jul. 20, 1999

[54] SEMICONDUCTOR DEVICE AND A MANUFACTURING METHOD THEREOF

[75] Inventors: Yasuhide Chigawa; Ippei Fujiyama; Kenji Matsuda, all of Unoke-machi, Japan

[73] Assignee: PFU Limited, Ishikawa, Japan

[21] Appl. No.: 08/891,493

[22] Filed: Jul. 11, 1997

[30] Foreign Application Priority Data

Jul. 11, 1996 [JP] Japan ..................................... 8-181832

[51] Int. Cl.$^6$ ........................... H01L 21/44; H01L 21/48; H01L 21/50
[52] U.S. Cl. .......................... 438/106; 438/107; 438/108; 438/118
[58] Field of Search ..................... 438/107, 108, 438/106, 118

[56] References Cited

U.S. PATENT DOCUMENTS 4,816,426  3/1989  Bridges et al. .
5,523,586  6/1996  Sakurai .
5,661,088  8/1997  Tessier et al. .

OTHER PUBLICATIONS

ICEMM Proceedings '93, Flip Chip Mounting Using Stud Bumps and Adhesives for Encapsulation, T. Kusagaya, et al., pp. 238–246.

*Primary Examiner*—John F. Niebling
*Assistant Examiner*—Josetta Jones

[57] ABSTRACT

A manufacturing method of a semiconductor device for mounting an LSI bare-chip component, or a bare chip, on a printed circuit board, or a substrate, with flip-chip bonding technology, that includes a recess forming step of forming recesses on substrate pads of the substrate, an adhesive coating step of applying adhesive to a location on the substrate at which the bare chip is to be placed, a chip mounting step of placing the bare chip on the substrate while aligning positions of the bumps formed on the chip pads of the bare chip and the substrate pads of the substrate, and an adhesive hardening step of hardening the applied adhesive.

24 Claims, 29 Drawing Sheets

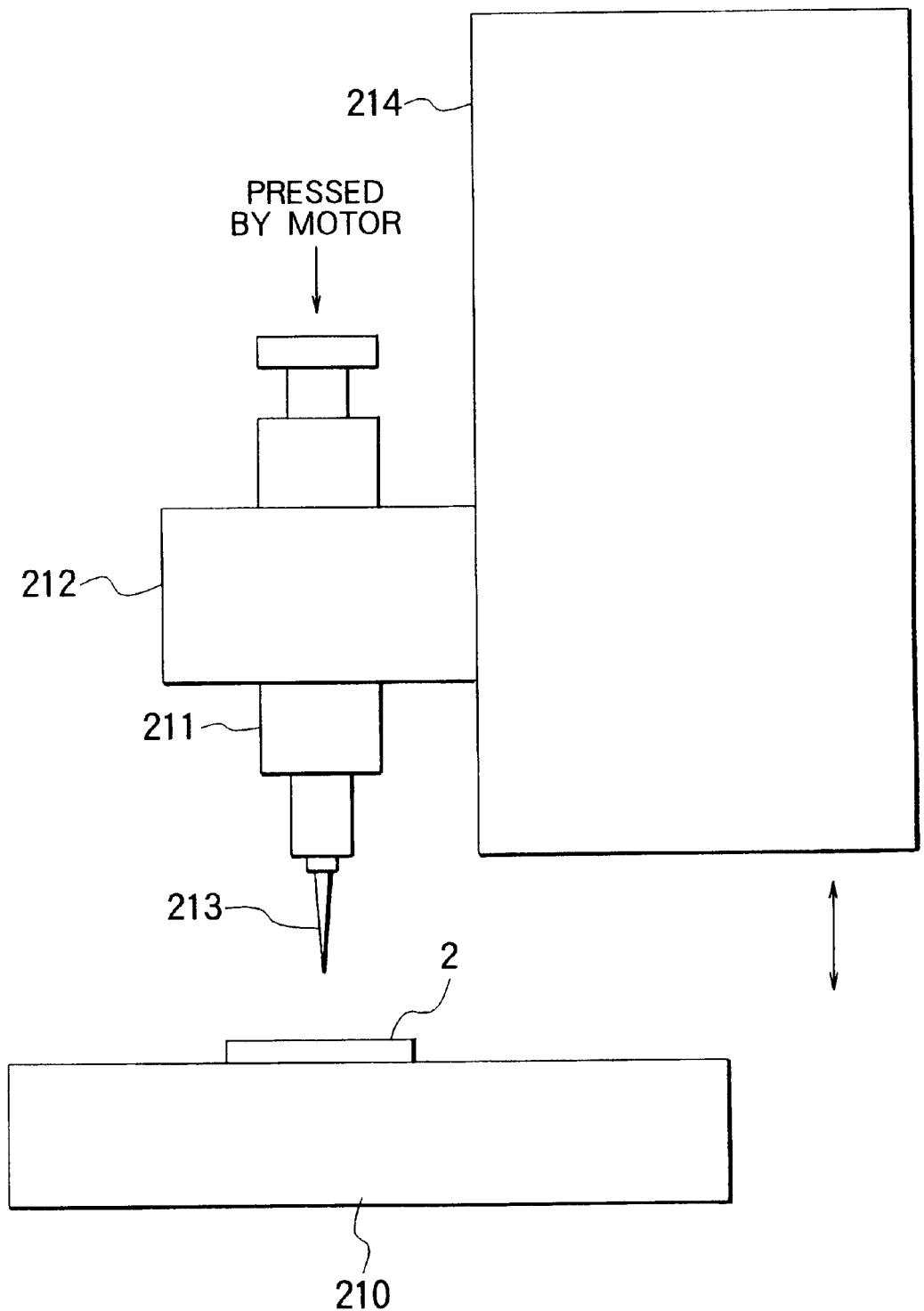

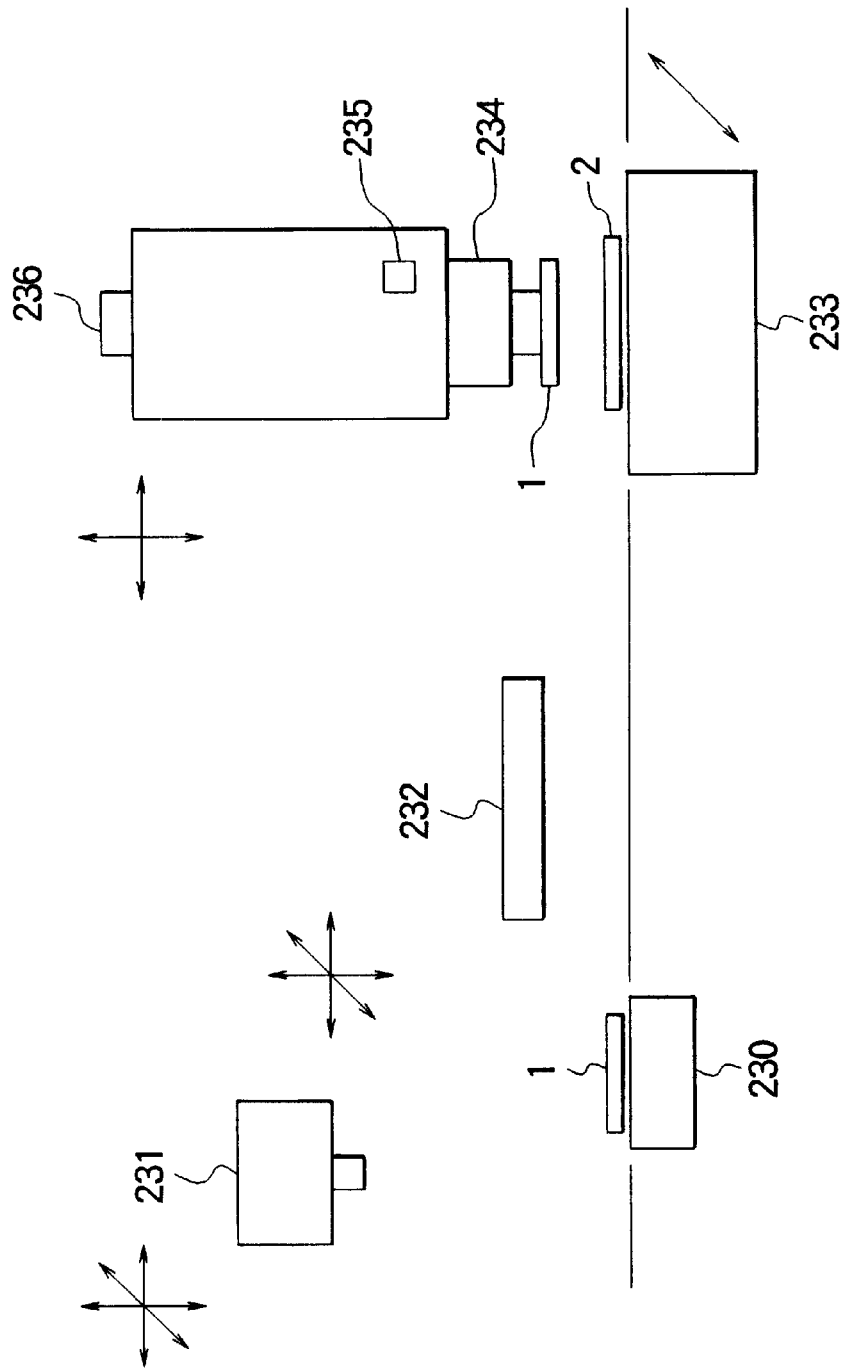

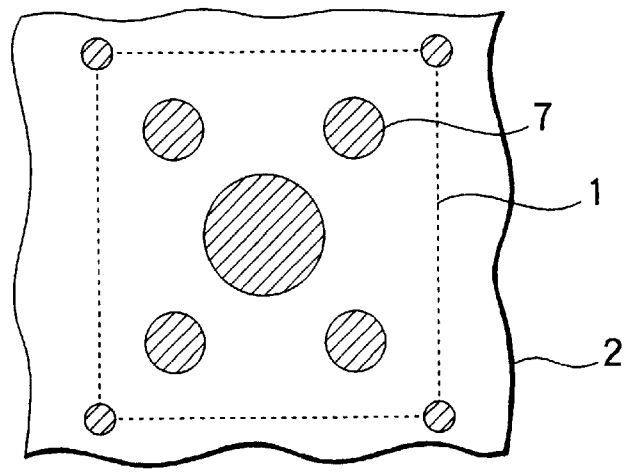
FIG. 17A
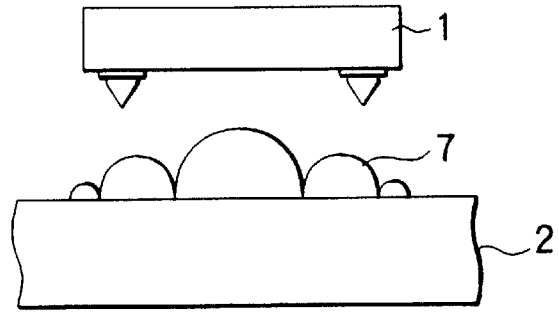
FIG. 17B
FIG. 18
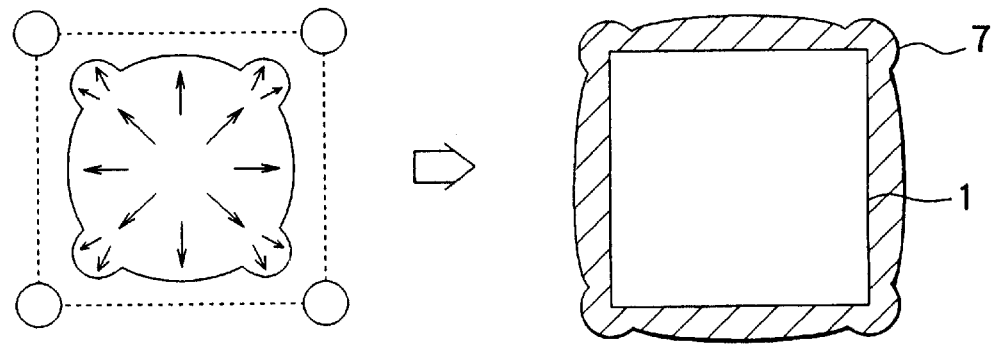

MATERIAL SPECIFICATIONS

| LSI CHIP (GATE ARRAY) | | SUBSTRATE | |
|---|---|---|---|
| ITEM | CONDITION | ITEM | CONDITION |
| CHIP SIZE ($mm^2$) | 10.5 × 10.5 | SUBSTRATE SIZE ($mm^3$) | 71 × 97 × 0.6 |
| MATERIAL | SILICON | MATERIAL | ORGANIC (FR-4) |
| PIN COUNTS | 232 | GLASS FIBER | INCLUDED |
| PIN PITCH ($\mu m$) | 132 | NUMBER OF LAYERS | 4 |
| | | PAD WIDTH ($\mu m$) | 50 |

RESULT OF PCT (105C 100% 1.2atm 72H)

RESULT OF TCT (-40C TO +100C)

NUMBER OF CYCLES (×100)

OTHER RELIABILITY TESTING RESULTS

| TEST ITEMS | CONDITIONS | RESULTS |
|---|---|---|
| HIGH TEMPERATURE AND HIGH HUMIDITY | 85C 85%RH 3500H | 0/24 |
| HIGH TEMPERATURE AND CREEP | 100C 2000H THE WARP OF 3% IS GIVEN | 0/6 |
| REFLOW | $N_2$ REFLOW 12 TIMES | 0/6 |
| VIBRATION | 15G OR 1.52MM AMPLITUDE 10~2KHz 3 DIRECTIONS | 0/3 |
| SHOCK | MIL-STD-202F METHOD 213B 50 G 11MS | 0/3 |

5,926,694

SEMICONDUCTOR DEVICE AND A MANUFACTURING METHOD THEREOF

BACKGROUND OF THE INVENTION

This invention relates generally to a semiconductor device and manufacturing method in which LSI bare-chip components are mounted on a printed circuit board with flip-chip bonding technology, and more specifically, to a semiconductor device and a manufacturing method thereof having improved reliability and productivity.

Electronic equipment manufacturers have manufactured electronic equipment by purchasing packaged LSIs (Large Scale Integrated Circuits) from semiconductor device suppliers and mounting them on printed circuit boards (PCBs). In recent years, however, there has been growing demand for smaller-sized electronic equipment, and electronic equipment manufacturers have met this demand by purchasing LSI bare chips (bare LSI components which are formed on a silicon substrate in a state where only electrodes or bonding pads are exposed from the final passivation film) from semiconductor suppliers and mounting them on a printed circuit board.

There are several methods of mounting bare chips components (or flip-chip components). One method is to mount bare chips on a printed circuit board by bonding (die bonding) the bare chips on the board while positioning the electrodes of the bare chips in the same direction as the electrodes of the board, and thereafter electrically connecting the electrodes of the chips and the board with wire bonding. Another method is to mount bare chips on a printed circuit board by facing the electrodes of the bare chips to the electrodes of the board and directly bonding the electrodes of the bare chips to the electrodes of the board.

The latter method is called face-down mounting, or flip-chip bonding, which has an advantage over the former method (face-up bonding) in that bare chips can be mounted in high density while having a disadvantage of low reliability and productivity. In order to meet the recent demand for smaller-sized electronic equipment, it is necessary to establish a method of mounting bare chips in high density and with higher reliability and productivity to solve the disadvantages of the flip-chip bonding process.

FIG. 39 illustrates a conventional structure of a semiconductor device in which LSI bare-chip components are mounted on a printed circuit board, or a substrate, with the flip-chip bonding technology. The structure shown in FIG. 39 was disclosed in the Proceeding of 1993 International Conference Multichip Module (Apr. 14–16, 1993, Radison Hotel, Denver).

As shown in the figure, a conventional type of a semiconductor device has a structure in which LSI bare chips are mounted with the flip-chip bonding technology, and has a raised electrode 4, called a bump, provided on a chip pad 3 of a bare chip component (or a bare chip) 1 and coated with electrically conductive paste 5 or solder (hereinafter generically referred to as electrically conductive paste for the sake of simplicity). The bare chip 1 is bonded to a printed circuit board, or a substrate 2 with adhesive 7 by flipping over the bare chip 1 on the printed circuit board 2 to attach the bump 4 coated with the conductive paste 5 to the substrate pad 6 of the substrate 2.

Typically, the bare chip 1 comprises a silicon substrate about 10 mm×10 mm in size and about 0.4 mm in thickness, and has 200 to 300 chip pads 3 comprising aluminum or other metal layers each about 100 μm×100 μm in size and a few μm in height. The gaps between the surface of the bare chip 1 and the surface of the substrate 2 is approximately 80 μm, that is, the height of the bump 4 is approximately 50 μm and the height of the substrate pad 6 approximately is 25 μm, respectively.

The semiconductor device of this type has been manufactured in the manufacturing process shown in FIG. 40.

First comes the bare-chip bump forming process in which the tip of a gold wire protruding from the tip of a capillary is melted by electric discharge into a ball, which is in turn bonded to the chip pad 3 of the bare chip 1 with ultrasonic vibration (wire bonding method), and the gold wire is then cut at the neck of the ball to form a spherical bump 4 approximately 60 μm in size on the chip pad 3 of the bare chip 1.

Next comes the bump leveling process in which the bare chip 1 is gently forced onto a flat glass substrate so as to eliminate variations in the height of the cut portions of the bumps 4, making the cut portions of the bumps 4 uniform in height.

Then, the conductive paste transfer process follows. Another glass substrate is prepared on which an approximately 15 μm thick film of electrically conductive paste (adhesive containing metal fillers) is applied. The bare chip 1 is forced on the glass substrate to transfer the conductive paste 5 on the top surface of the bump 4. Then, the conductive paste 5 adhering to the bump 4 is half-hardened by heating the bare chip 1 for a certain period.

In the subsequent mounting process, the bare-chip component 1 is aligned with the substrate 2 on which the adhesive has been applied, and heated for a certain period while holding it in position by exerting a certain load to harden the adhesive 7 between the bare chip 1 and the substrate 2. After that, the semiconductor device is completed by perfectly hardening the conductive paste 5.

As described above, in the conventional structure, a bare chip 1 is bonded to a substrate 2 with adhesive 7, while bringing a bump 4 formed on the chip pad 3 of the bare chip 1 into close contact with the substrate pad 6 of the substrate 2, by employing an electrically conductive paste 5 to ensure reliability in electrical connection between the bump 4 and the substrate pad 6.

With the prior-art structure, however, productivity in manufacturing semiconductor devices has not necessarily been good.

SUMMARY OF THE INVENTION

It is the first object of this invention to improve the reliability of a semiconductor device in which LSI bare-chip components, or a bare chip, are mounted on a printed circuit board, or a substrate, with flip-chip bonding.

It is the second object of this invention to improve the productivity of a semiconductor device in which bare chips are mounted on a substrate with flip-chip bonding.

It is the third object of this invention to provide a semiconductor manufacturing method that accomplishes the first object of this invention.

It is the fourth object of this invention to provide a semiconductor manufacturing method that accomplishes the second object of this invention.

To accomplish these objectives, this invention provides a structure where positive electrical connection is achieved between a bare chip and a substrate without using electrically conductive paste in mounting the LSI bare chip on the substrate with flip-chip bonding.

BRIEF DESCRIPTION OF THE DRAWINGS

FIG. 5 is a block diagram of a dispenser.

FIG. 7 is a block diagram of a chip bonder.

FIGS. 17A and 17B show an embodiment of the adhesive coating of this invention.

FIG. 18 is a diagram of the adhesive coating of this invention.

DETAILED DESCRIPTION OF PREFERRED EMBODIMENTS

Now, preferred embodiments of this invention will be described in the following. To begin with, this invention will be outlined, referring to FIG. 1 showing the principle thereof, and then specific embodiments of this invention will be described in detail.

Figure 1:
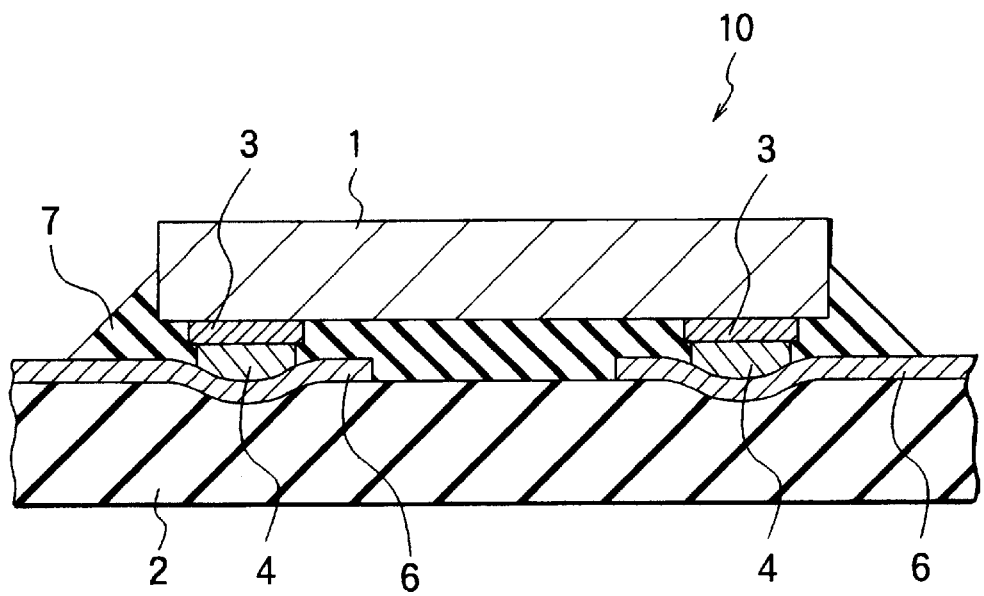
FIG. 1 is a sectional view illustrating the structure of this invention.
Figure 2:
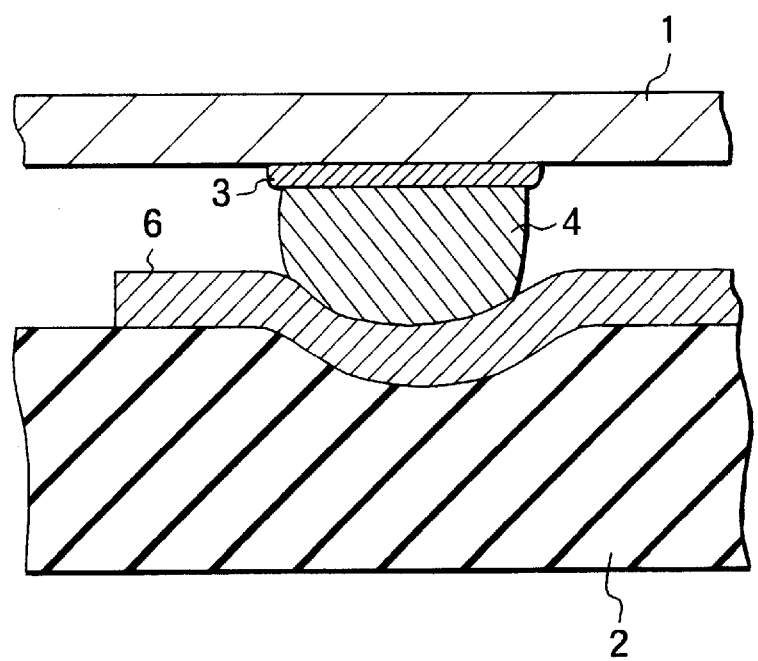
FIG. 2 is a partially enlarged sectional view of this invention.

In FIG. 1, a semiconductor device 10 according to a preferred embodiment of the present invention includes an LSI bare chip 1 and a substrate 2, a chip pad 3 of the bare chip 1 being electrically connected to a substrate pad 6 of the substrate 2, and the bare chip 1 being bonded to the substrate 2 with adhesive 7. As shown in FIG. 1, the semiconductor device 10 of this invention has such a structure that a portion of the substrate pad 6 corresponding to the chip pad 3 is formed concave or recessed toward the substrate 2, and the chip pad 3 has a bump 4 which is forced onto the concave surface of the chip pad 3.

The semiconductor device 10 can be manufactured as follows: the bump 4 is provided on the chip pad 3, adhesive is applied or coated to an area of the substrate 2 at which the bare chip 1 is to be placed, the bare chip 1 is mounted on the substrate 2 on which the adhesive has been applied while aligning the positions of the bump 4 and the substrate pad 6, the bump 4 of the bare chip 1 is forced onto a recessed portion formed on the substrate pad 6, and the applied adhesive is allowed to harden.

Since the substrate pad 6 of the semiconductor device 10 has a concave, or recessed surface toward the substrate 2, even if the bare chip 1 is displaced in a direction away from the substrate 2, the concave, or recessed surface tends to return to its original shape due to the resiliency of the substrate 2. This ensures positive contact between the bump 4 and the substrate pad 6, ensuring positive electrical connection between the chip pad 3 and the substrate pad 6 without using conductive paste and leveling the bumps 4.

Furthermore, even if a lateral shift is caused between the bare chip 1 and the substrate 2 due to the difference between the thermal expansion coefficients of the bare chip 1 and the substrate 2 or due to the swelling of the adhesive, the concave surface of the substrate pad 6 prevents the movement of the bump 4, ensuring electrical connection between the chip pad 3 and the substrate pad 6, irrespective of temperature changes or moisture absorption by the adhesive.

Moreover, since the substrate pad 6 and the bump 4 come into contact with each other in a state where a protruded portion is mated with a recessed portion, and the contact area between the bump 4 and the substrate pad 6 is increased due to the concave surface, electrical connection between the chip pad 3 and the substrate pad 6 is insured.

In addition, the semiconductor device 10 can be manufactured with high productivity because the bare chip 1 and the substrate 2 are bonded without using conductive paste with the flip-chip bonding technology, and the device 10 can accomplish high reliability because positive connection between the bare chip 1 and the substrate 2 is maintained.

Next, preferred embodiments of the present invention will be described in detail.

Figure 3:
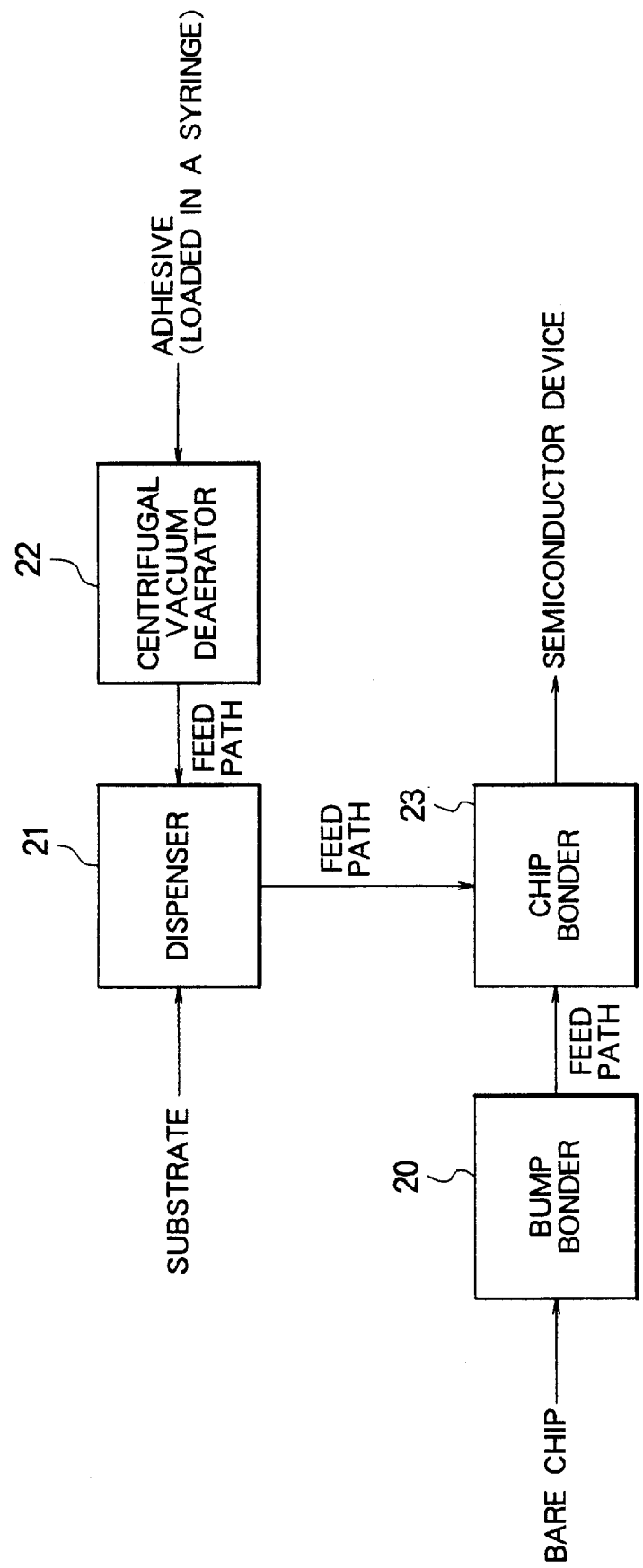
FIG. 3 is a block diagram of the semiconductor device manufacturing line.

FIG. 3 shows an example of a manufacturing line for manufacturing the semiconductor device 10 according to a preferred embodiment of the present invention. As shown in FIG. 3, the manufacturing line for manufacturing the semiconductor device 10 includes a bump bonder 20, a dispenser 21, a centrifugal vacuum deaerator 22, and a chip bonder (or a flip-chip bonder) 23.

The bump bonder 20, upon receiving a bare chip 1 from the transfer line, forms a raised electrode, called a bump, on a chip pad 3 of the bare chip 1.

Figure 4:
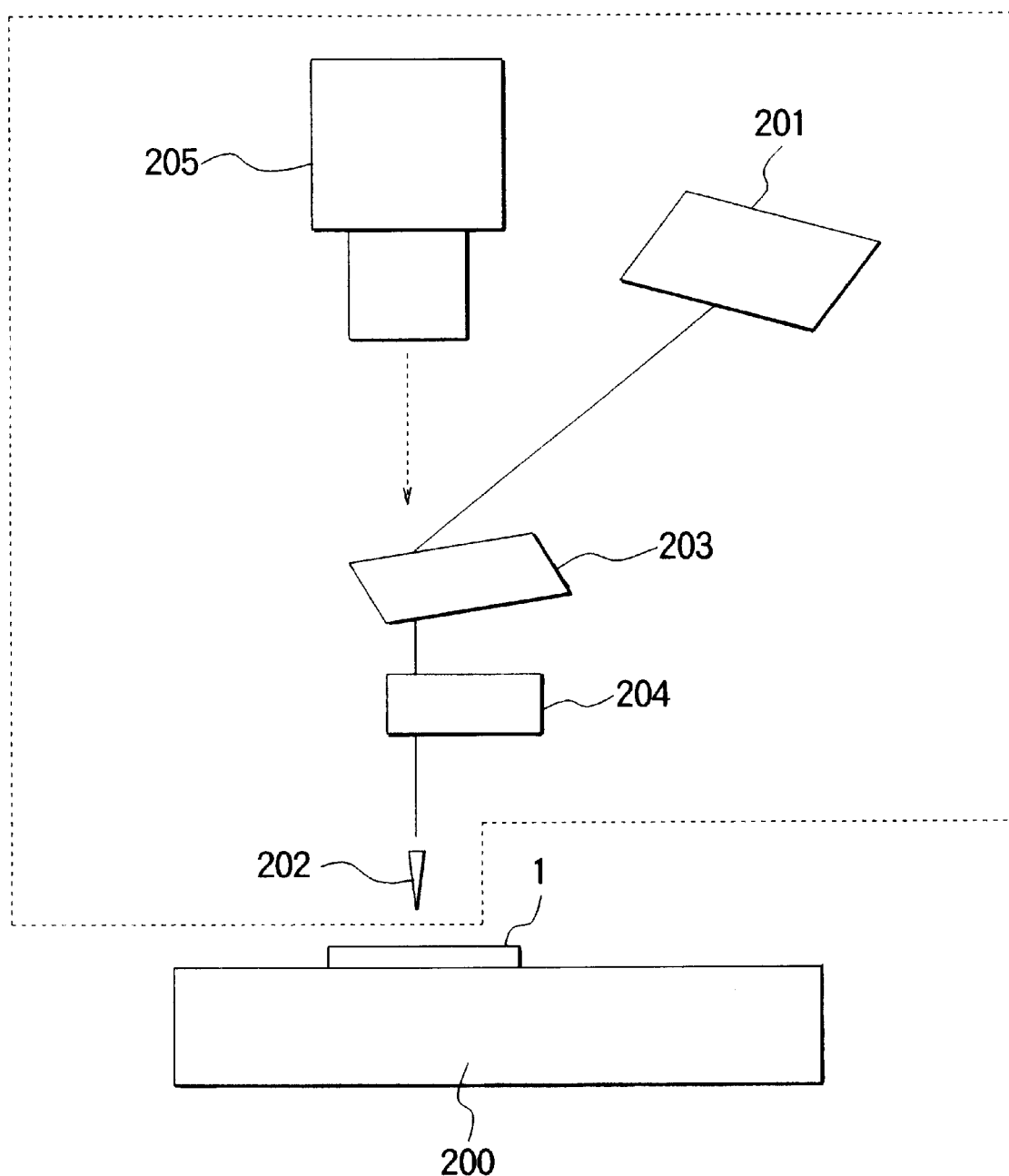
FIG. 4 is a block diagram of a bump bonder.

As shown in FIG. 4, the bump bonder 20 includes a stage 200 on which the bare chip 1 is to be placed, a gold-wire housing 201 for housing a gold wire as the material of the bump 4, a capillary 202 for guiding a gold wire fed from the gold-wire housing 201 to the position of the chip pad 3 on the bare chip 1, and forcing a gold ball produced on the tip of the gold wire onto the chip pad 3, and applying an ultrasonic wave to bond the gold ball to the chip pad 3. A tension damper 203 provides tension to the gold wire fed to the capillary 202 by pulling up the gold wire, a cut damper 204 cuts the gold wire fused to the chip pad 3 of the bare chip 1 by pulling up the gold wire, and a CCD camera 205 detects the position of the chip pad 3 of the bare chip 1. The bump bonder 20 also has a torch unit and an ultrasonic oscillator (both not shown).

The gold-wire housing 201, the capillary 202, the tension damper 203, the cut damper 204, the CCD camera 205 and the torch unit constitute an integral bonding head that is adapted to be movable in the XY direction using a driving mechanism (not shown).

In the bump bonder 20 having such a structure, upon completion of the aligning of the chip pad 3 of the bare chip 1, a spherical bump 4 about 60 μm in size is formed on the chip pad 3 of the bare chip 1 as follows: a ball is formed on the tip of the gold wire with an electric discharge initiated by the torch unit (not shown) that is moved near the tip of the gold wire, then the ball is brought into contact with the chip pad 3 by the capillary 202, and the capillary 202 is caused to ultrasonically vibrate with an ultrasonic oscillator to bond the ball to the chip pad 3, and the gold wire is pulled up by using the cut damper 204 to cut the ball from the gold wire.

Figure 6A:
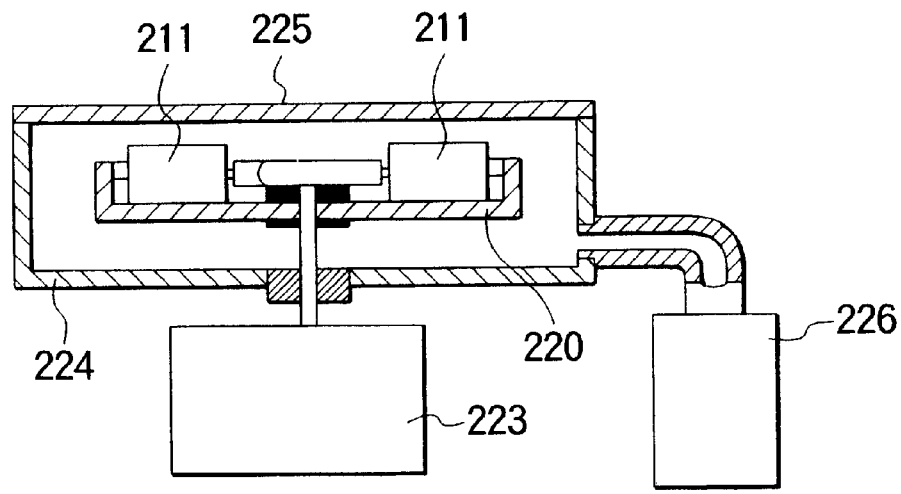
FIGS. 6A and 6B are diagrams of a centrifugal vacuum deaerator.
Figure 6B:
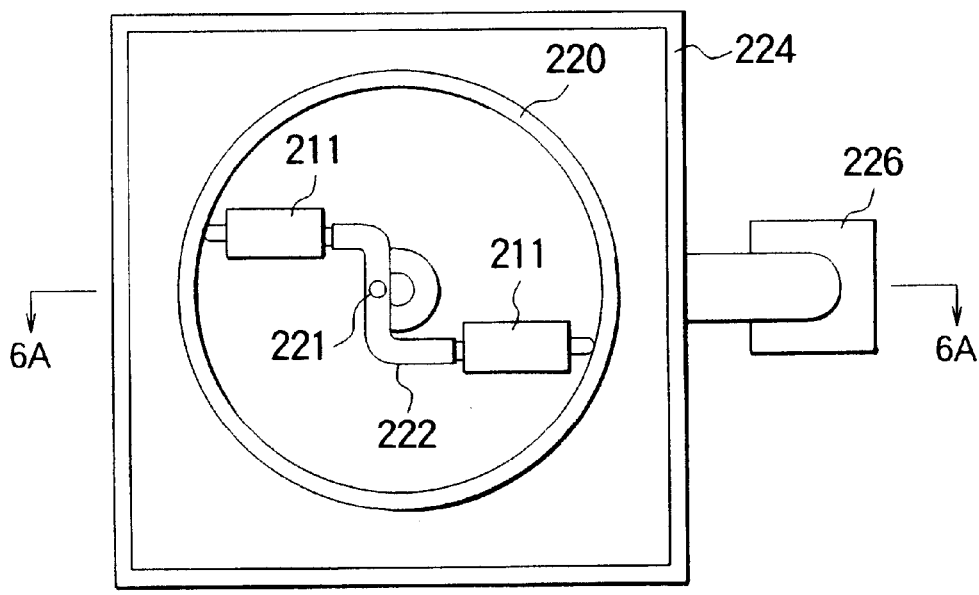

The dispenser 21 is used to apply adhesive to the substrate 2 received from the transfer line. As shown in FIG. 5, the dispenser 21 comprises an XY table 210 for holding and moving the substrate 2 in the XY direction, a holder 212 for holding a syringe 211 filled with adhesive, a dispenser nozzle 213 for dispensing a very small amount of the adhesive in the syringe 211 to the substrate 2, a head 214 for vertically moving the syringe 211, and a pressuring mechanism (not shown). The dispenser 21 having such a structure, upon completion of the aligning of the substrate 2, applies adhesive to the substrate 2 by extruding the adhesive in the syringe 211 using the pressurizing mechanism (not shown). The centrifugal vacuum deaerator 22, upon receipt of the adhesive contained in the syringe 211 (that is connected to the outside through a small gap) from the transfer line, feeds the adhesive to the dispenser 21 after deaerating or removing voids trapped in the adhesive. As shown in FIGS. 6A (cross-sectional view) and 6B (top view), the centrifugal vacuum deaerator 22 includes a rotating member 220 for holding two syringes 211 filled with adhesive, a hollow member 222 having an opening 221 for connecting the syringes 211 held to the rotating member 220, a motor 223 for rotating the rotating member 220, a vacuum chamber 224 for housing the rotating member 220 while maintaining airtightness, a lid 225 for opening the vacuum chamber 224, and a vacuum source 226 for reducing the pressure inside the vacuum chamber 224 by pumping out air from the vacuum chamber 224.

In the centrifugal vacuum deaerator 22 having such a structure, after the two syringes 211 filled with adhesive have been held to the rotating member 220 and connected via the hollow member 222, the pressure inside the vacuum chamber 224 is reduced using the vacuum source 226, and the rotating member 220 is caused to rotate by the motor 223. This causes the voids trapped in the adhesive in the syringes 211 to be moved toward the opening 221 of the hollow member 222 due to centrifugal action and reduced pressure, and eventually removed from the adhesive.

The chip bonder 23 manufactures the semiconductor device according to this invention by receiving the bare chip 1 from the bump bonder 20 via the transfer line and the substrate 2 coated with adhesive from the dispenser 21 via the transfer line, and bonding the bare chip 1 to the substrate 2.

As shown in FIG. 7, the chip bonder 23 includes an orienter 230 for holding the bare chip 1 to roughly modify the inclination thereof, a pickup head 231 for setting the bare chip 1 on the orienter 230, an optical probe 232 for taking an image of the circuit surface of the bare chip 1 or an image of the surface of the substrate 2, a stage 233 for holding the substrate 2 in position, a bonding head 234 for picking up and bonding the bare chip 1 placed on the orienter 230 to the substrate 2 held in position on the stage 233, a load cell 235 for measuring the pushing force of the bonding head 234, and an encoder 236 for measuring the movement of the bonding head 234. The bonding head 234 has a heating mechanism for heating the bare chip 1 and the stage 233 has a heating mechanism for heating the substrate 2.

In the chip bonder 23 having such a structure, the semiconductor device 10 is manufactured as follows: the attitude of the bare chip 1 is roughly adjusted to a predetermined position, the bonding head 234 is caused to move to pick up the bare chip 1, the bare chip 1 is moved to a predetermined location on the stage 233, an optical probe 232 is inserted between the bare chip 1 and the substrate 2 to align the position of the bump 4 to the corresponding position of the substrate pad 6, and then heating the bare chip 1 to harden the adhesive applied to the substrate 2 while forcing onto the substrate 2.

Next, a manufacturing method for manufacturing the semiconductor device 10 according to a preferred embodiment of the present invention using the manufacturing line having the aforementioned structure will be described.

Figure 8:
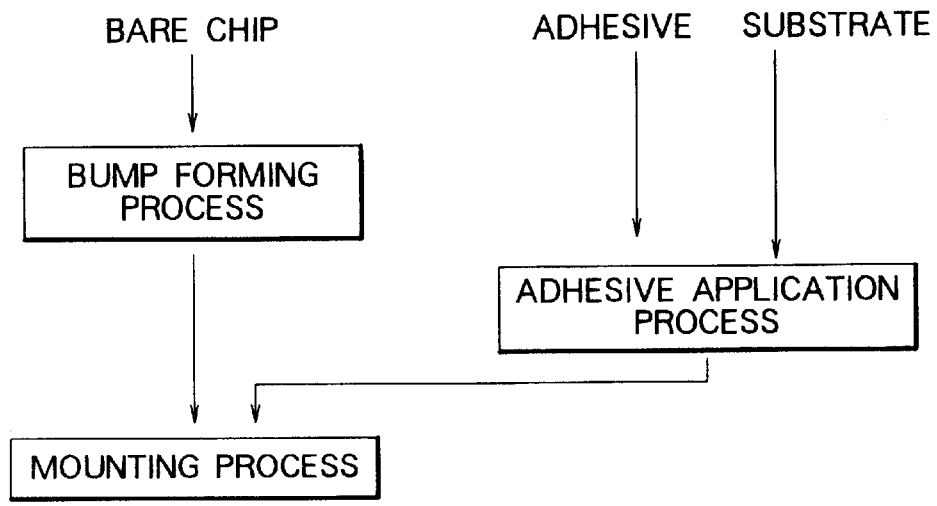
FIG. 8 shows an embodiment of this invention.

As shown in FIG. 1, the semiconductor device 10 of this invention is characterized by a structure in which an area of the substrate pad 6 corresponding to the chip pad 3 has a shape concave toward the substrate, and a bump 4 which is forced onto the concave area of the substrate pad 6 is provided on the chip pad. FIG. 8 shows a preferred embodiment of the manufacturing method of the semiconductor device 10 according to the present invention.

When manufacturing the semiconductor device 10 shown in FIG. 1, the bump 4 is first formed on the chip pad 3 of the bare chip 1 using the bump bonder 20. Simultaneously with the formation of the bump 4, adhesive is applied to the substrate 2 using the dispenser 21.

After the bump 4 has been formed on the chip pad 3 of the bare chip 1 and adhesive has been applied to the substrate, the bare chip 1 is placed on the substrate 2 while accurately aligning the position of the bump 4 to the position of the substrate pad 6. Then a load is applied to the bare chip 1 to force the bare chip 1 onto the substrate 2 so that the substrate pad 6 is recessed. After that, while maintaining the bare chip 1 and the substrate 2 in that state, heat is applied to harden the adhesive between the bare chip 1 and the substrate 2. By releasing the load, the manufacture of the semiconductor device 10 shown in FIG. 1 is completed.

In this way, the semiconductor device 10 shown in FIG. 1 can be manufactured with high productivity without using conductive adhesive and leveling the bumps 4. (needless to say, the device 10 can also be manufactured using leveling the bumps 4).

Furthermore, even when a lateral shift takes place between the bare chip 1 and the substrate 2 due to differences in the thermal expansion coefficients of the bare chip 1 and the substrate 2, or due to the swelling of adhesive, electrical connection between the chip pad 3 and the substrate pad 6 can be maintained irrespective of temperature changes because the concave area of the substrate pad 6 acts to prevent the bump 4 from moving.

With the semiconductor device 10 manufactured in this way, even if the bare chip 1 is displaced in a direction away from the substrate 2, the bump 4 is kept in close contact with the substrate pad 6 since the concave area of the substrate pad 6 bonded to the bump 4 tends to restore to its original shape due to the resiliency of the substrate 2. As a result, electrical connection between the chip pad 3 and the substrate pad 6 can be positively maintained without using conductive adhesive.

Moreover, electrical connection can also be positively maintained between the chip pad 3 and the substrate pad 6 because the contact area between the bump 4 and the substrate pad 6 is increased.

The semiconductor device 10 according shown in FIG. 1 has such a structure as to maintain positive connection between the chip pad 3 and the substrate pad 6 using the resiliency of the substrate 2. For this reason, the substrate 2 should preferably be made of a material having sufficient elastic deformability.

Although the bump 4 is formed with the wire bonding technology, other technology, such as plating or transfer technology, may be used to form the bump 4. The bump 4 is not limited to a metallic bump, such as a gold bump.

Figure 9:
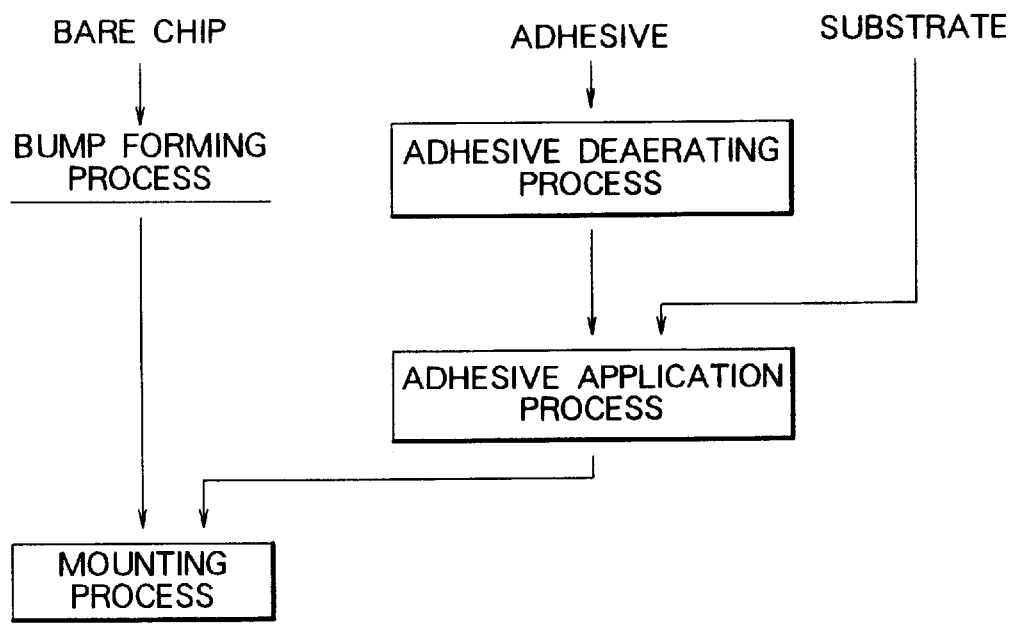
FIG. 9 shows another embodiment of this invention.
Figure 10:
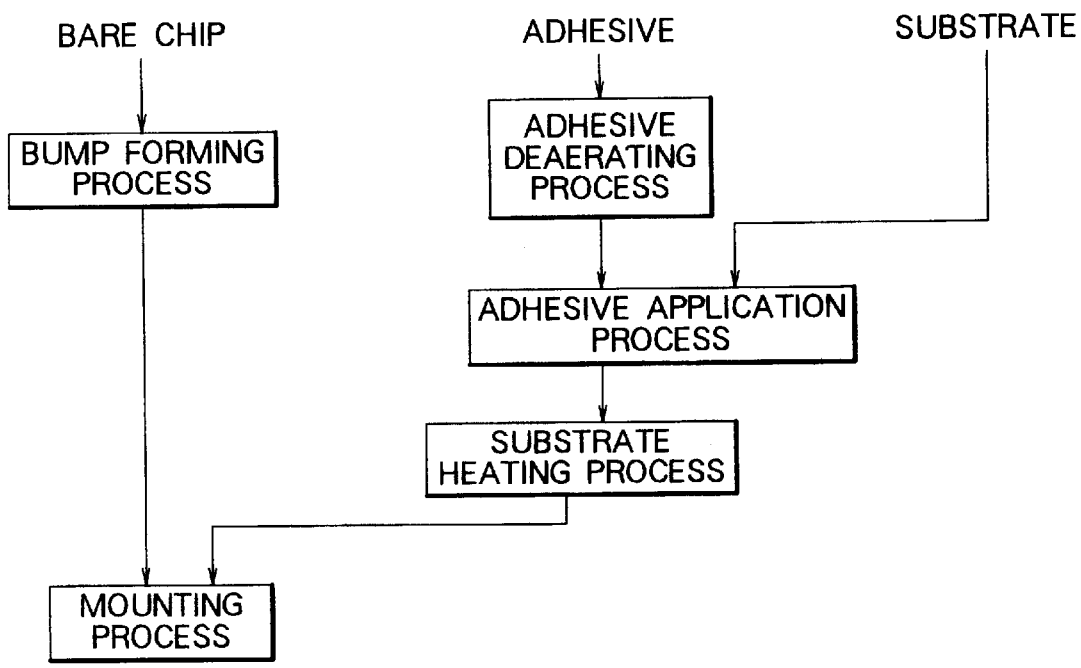
FIG. 10 shows still another embodiment of this invention.

FIGS. 9 and 10 show other embodiments of the manufacturing method of the semiconductor device 10 shown in FIG. 1. These embodiments are characterized in that they have a treatment process for removing voids trapped in the adhesive applied to the substrate 2. This is because the presence of voids in the adhesive lowers the bonding strength between the bare chip 1 and the substrate 2, and makes it difficult to control the coating amount of the adhesive.

The preferred embodiment shown in FIG. 9 has a deaerating process to remove voids trapped in the adhesive applied to the substrate 2 using the centrifugal vacuum deaerator 22 before the adhesive application process is carried out in the embodiment shown in FIG. 8.

The preferred embodiment shown in FIG. 10, on the other hand, has a heating process for temporarily heating the substrate 2 on which the adhesive has been applied using the heating mechanism provided in the stage 233 of the chip bonder 23, after the adhesive application process carried out in the preferred embodiment shown in FIG. 9 to remove the voids entering in the adhesive during application.

Figure 11:
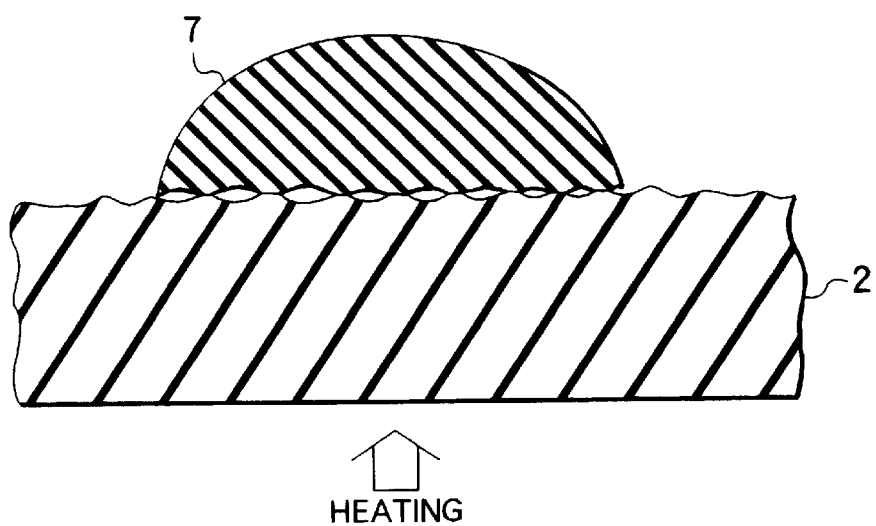
FIG. 11 is a partially enlarged sectional view of deaerating treatment.

That is, taking into consideration the fact that voids tend to be trapped in the irregular surface of the substrate 2 when adhesive is applied on the substrate 2, as shown in FIG. 11, the substrate 2 on which the adhesive has been applied is temporarily heated to lower the viscosity of the adhesive, thereby removing voids trapped in the irregular surface.

Figure 12:
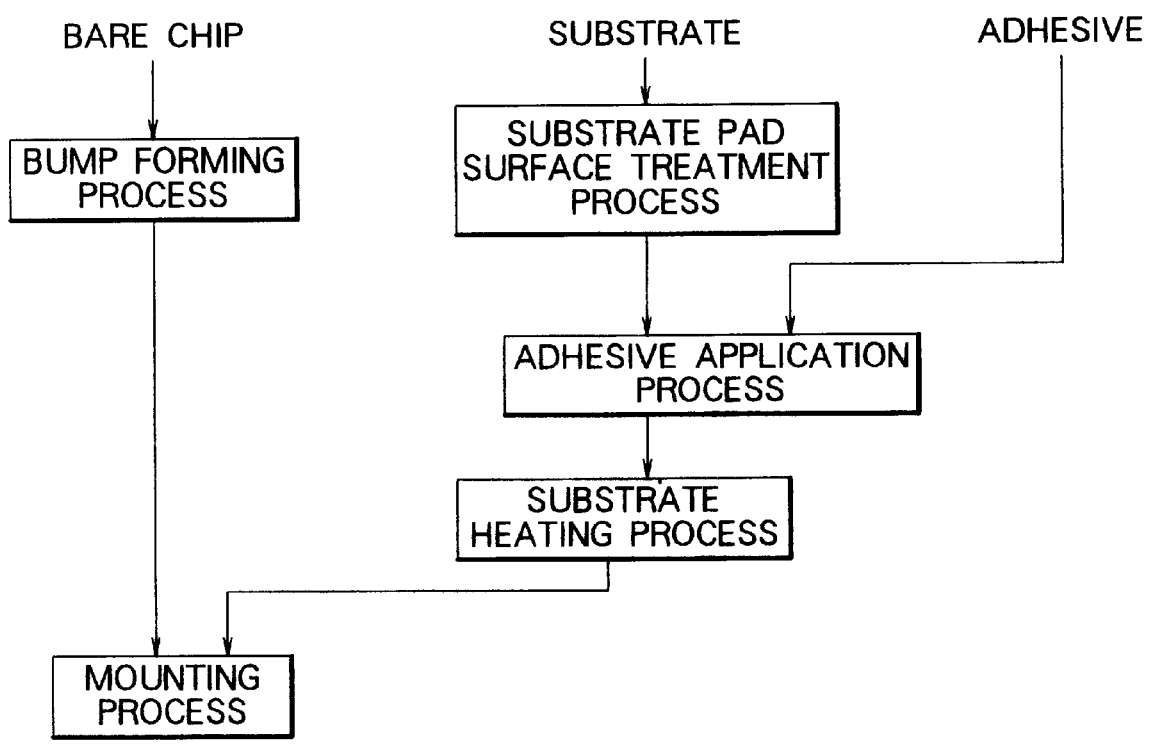
FIG. 12 shows a further embodiment of this invention.

FIG. 12 shows still another preferred embodiment of the manufacturing method of the semiconductor device 10 according to this invention shown in FIG. 1. This embodiment is characterized by having a surface treatment process to form irregularities on the surface of the substrate pad 6 of the substrate 2 before the adhesive application process carried out in the embodiment shown in FIG. 8 to improve the reliability of electrical connection between the bump 4 and the substrate pad 6.

Figure 13A:
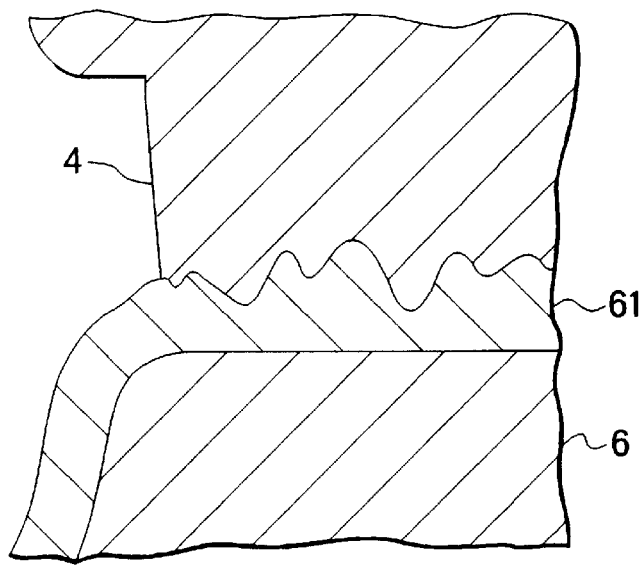
FIGS. 13A and 13B are partially enlarged sectional views of surface treatment.
Figure 13B:
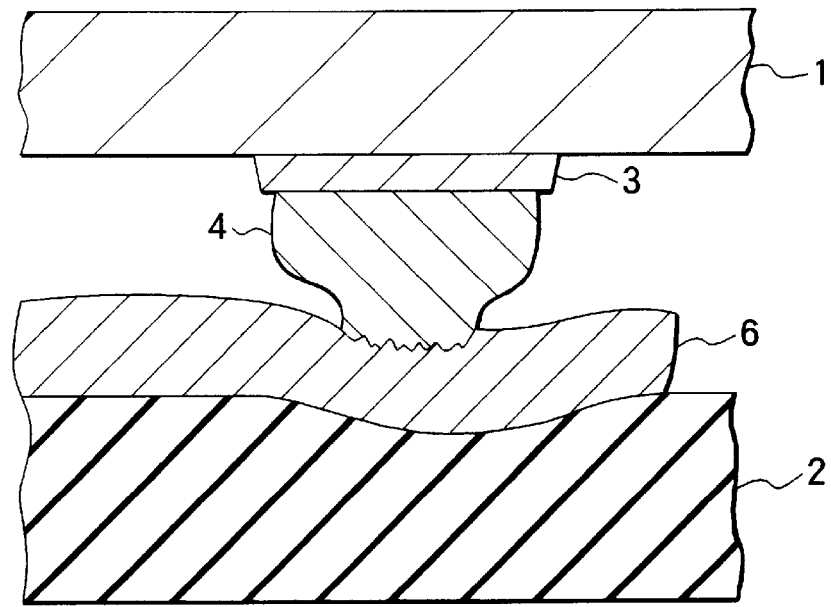

That is, as shown in FIG. 13A, irregularities a few μm in depth are formed on the gold-plated layer 61 on the surface of the substrate pad 6 so as to cause the gold bump 4 to bite into the irregularities, thereby to improve the reliability of electrical connection between the bump 4 and the substrate pad 6. Even when the surface of the substrate pad 6 is thin or not gold-plated, the reliability of electrical connection between the bump 4 and the substrate pad 6 can be improved by forming irregularities a few μm deep on the surface of the substrate pad 6 and causing the gold bump 4 to bite into the irregularities, as shown in FIG. 13B.

Figure 14A:
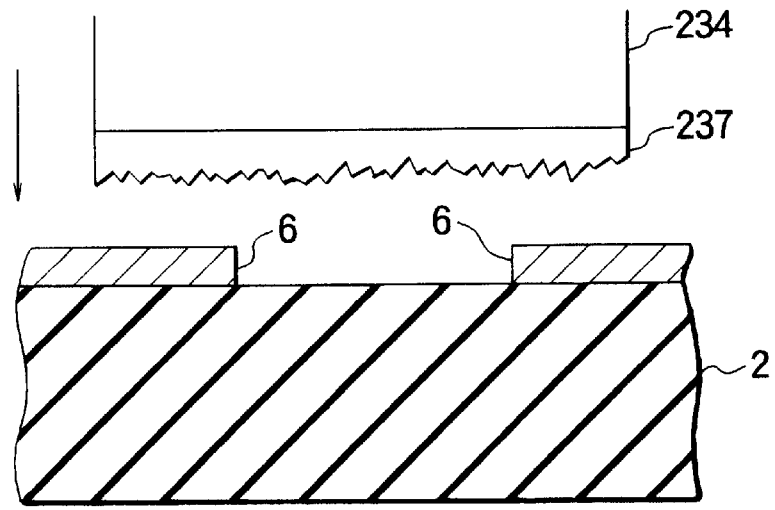
FIGS. 14A and 14B are diagrams of surface treatment.
Figure 14B:
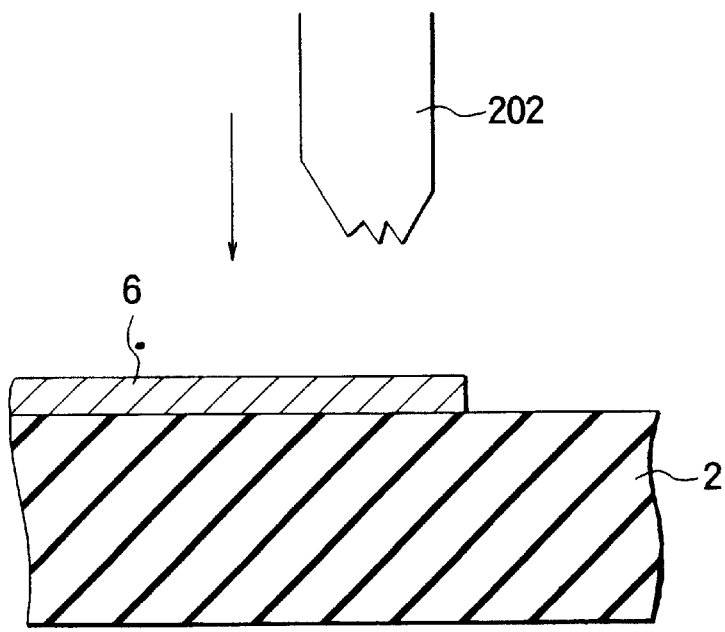
Figure 15A:
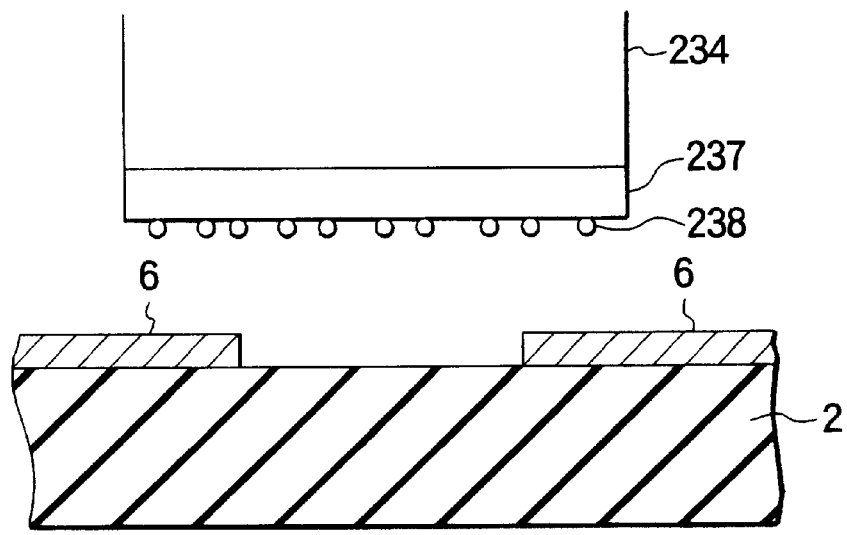
FIGS. 15A and 15B are diagrams of surface treatment.
Figure 15B:
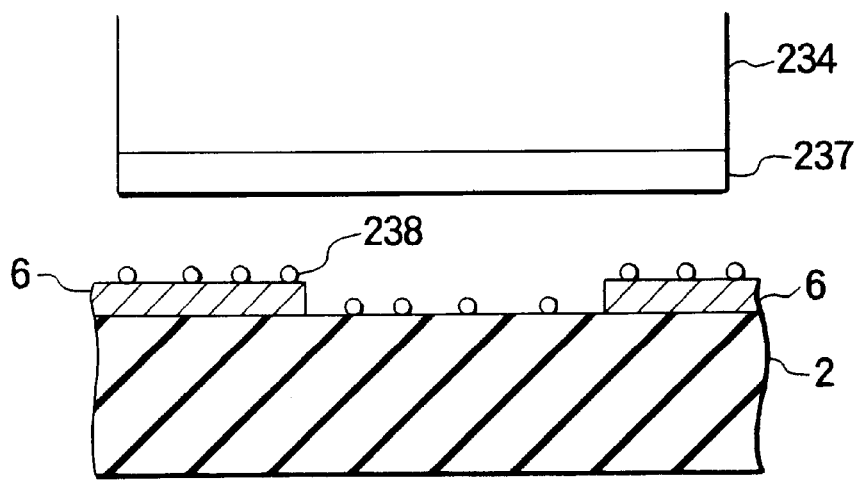

The surface treatment of the substrate pad 6 may be achieved by several methods: a stainless steel plate (SUS plate) or ceramic plate having irregularities a few μm in depth on the surface thereof is adhered to the bonding head 234 of the chip bonder 23 and is forced onto the substrate 2, as shown in FIG. 14A; or a capillary 202 having irregularities a few μm in depth at the tip thereof is attached to the bump bonder 20 and is repeatedly hammered the substrate pad 6, as shown in FIG. 14B; or a stainless steel plate 237 having extremely hard particles a few μm in particle size is adhered to the bonding head 234 of the chip bonder 23 and is forced onto the substrate 2, as shown in FIG. 15A; and or extremely hard particles 238 a few μm in particle size is sprayed onto the surface of the substrate 2 and the bonding head 234 of the chip bonder 23 having a flat stainless steel plate 237 is forced onto the substrate from above and then the sprayed particles 238 is removed by using solvent, etc.

Next, a process of applying adhesive in the manufacturing method shown in FIG. 8, will be described in detail.

Figure 16:
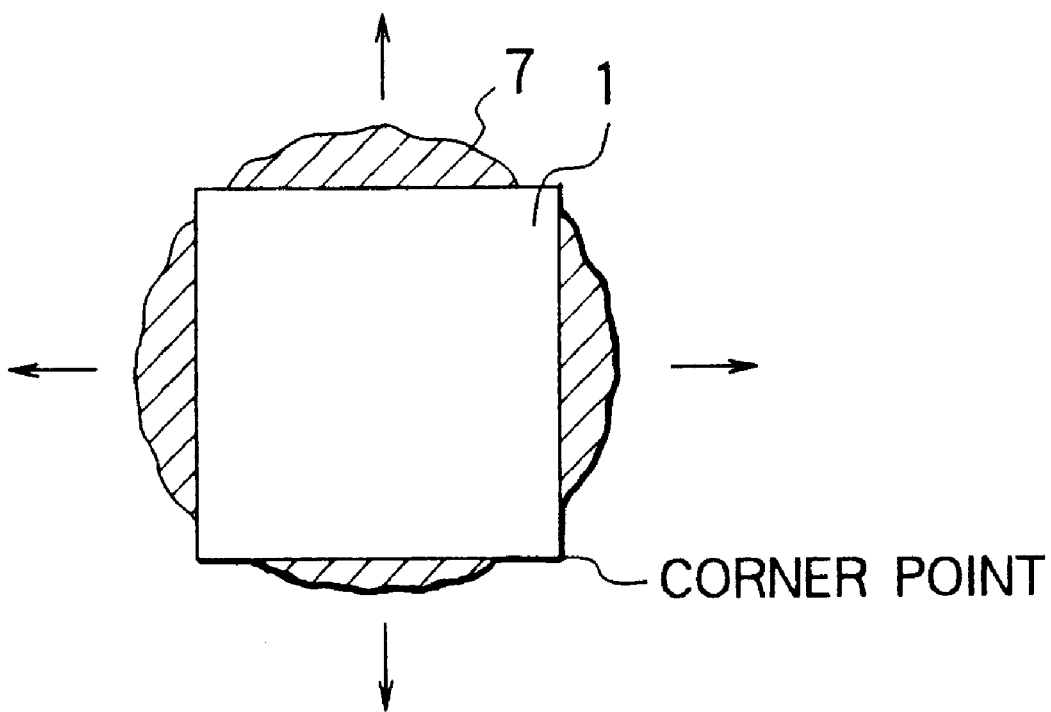
FIG. 16 is a diagram of the conventional method of adhesive coating.

In conventional methods, when applying adhesive to the substrate 2, a dispenser 21 has been employed to apply adhesive to the central area of the location at which the bare chip 1 is placed. With the conventional application method, however, corner areas of the bare chip 1 tend to be left uncoated, as shown in FIG. 16. That is, the adhesive applied to the central area of the bare chip 1 is distributed radially as the bare chip 1 is forced onto the substrate 2. The adhesive spreads outside the bare chip 1 before reaching the corner areas thereof. Then, the adhesive spreading outside the bare chip 1 tends to run faster due to the lower flow resistance outside the bare chip 1 compared with the flow resistance beneath the corner areas. This results in the corner areas of the bare chip 1 left uncoated.

In the present invention, therefore, adhesive is applied to the center point of the location at which the bare chip 1 is to be placed, four corner points of the bare chip 1, and four intermediate points between the center point and the corner points, as shown in FIG. 17A, a top view, and FIG. 17B, a side view. The amount of application of adhesive to the intermediate points is reduced compared with that for the center point, and the amount of application to the corner points is reduced compared with that for the intermediate points. With this arrangement, adhesive can be applied evenly to the corner points of the bare chip 1 without trapping voids, as shown in FIG. 18.

The dotted lines in FIG. 17A denote the location at which the bare chip 1 is to be placed. The application of adhesive at the intermediate points can be omitted, and adhesive can be applied at much more intermediate points.

Next, the loading process carried out in the mounting process in the manufacturing method shown in FIG. 8, etc. will be described.

As shown in FIG. 8, the semiconductor device 10 of this invention shown in FIG. 1 is manufactured by placing the bare chip 1 on the substrate 2, applying a load to the bare chip 1 to force the bare chip 1 onto the substrate 2 until the substrate pad 6 is recessed, subjecting the bare chip 1 and the substrate 2 in that state to a heat treatment to harden the adhesive between the bare chip 1 and the substrate 2, and then releasing the load. The load must be applied accurately to the bare chip 1.

The relationship between the load to the substrate pad 6 and the recessed depth (sunken depth) of the substrate 2 is measured in advance in accordance with the width and length (these are called the dimensional values in the Specification) of the substrate pad 6 and by type of the substrate 2. Based on the measurements, the correlation between the load per unit area and the recessed depth of the substrate pad 6 is obtained. Then, the width and length of the substrate pad 6 of the substrate 2 being loaded are measured using the optical probe 232 of the chip bonder 23. Based on the measurements of the width and length or the dimensional values, and the correlation calculated in advance, the load to be applied to the bare chip 1 is determined to carry out the loading process according to the substrate pad 6.

With this loading process, the optimum loading can be carried out to allow for changes in the width of the substrate pad 6 depending on the lots of the substrate 2. Thus, the necessary recessed amount of the substrate pad 6 can be ensured on any substrate 2. The measurement of the width/length of the substrate pad 6 of the substrate 2 being loaded is performed at multiple points to calculate the average value. In doing so, measuring points should preferably include the edge and central parts of the substrate 2 at which the variation of the width of the substrate pad 6 may vary greatly.

Figure 19:
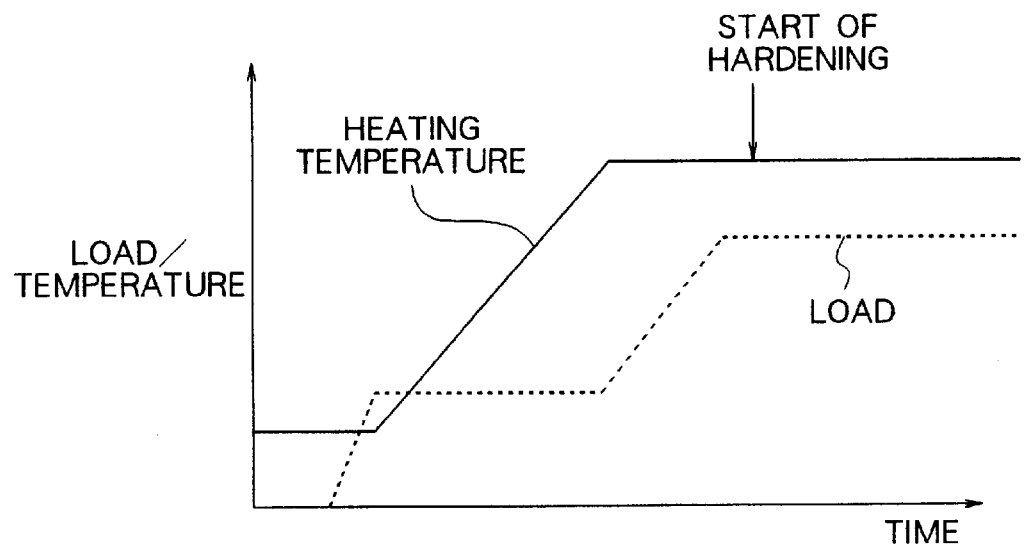
FIG. 19 is a diagram of the load treatment of this invention.

Furthermore, there can be an arrangement in which loading can be performed in two steps to positively remove the voids contained in the adhesive. That is, as shown in FIG. 19, a relatively small load is applied onto the bare chip 1 in the initial stage until the temperature reaches a predetermined value, and after the temperature value has reached a predetermined value, a load large enough to achieve the necessary recessed amount on the substrate pad 6 is applied onto the bare chip 1. In this way, loading is performed in two stage; a relatively small load is exerted in the initial stages, and the load is increased in the latter stage. The switching timing of loading can be controlled by using the predetermined period.

With this arrangement, the substrate pad 6 is hardly recessed in the initial stage where only a small load is applied onto the bare chip 1. At this time, the gap between the bare chip 1 and the substrate 2 is large and the viscosity of the adhesive is lowered due to temperature rise. As a result, voids in the adhesive can readily evolve from the adhesive. After that point of time, the load is increased to a predetermined level to achieve the required recessed amount of the substrate pad 6 until the adhesive begins hardening. At this time, the voids that are in a state to readily escape are removed as they are extruded, together with the adhesive.

Furthermore, there can be an arrangement where control is effected so as to make the recessed amount of the substrate pad 6 constant by detecting the recessed amount of the substrate pad 6, instead of making the load applied to the bare chip 1 constant.

The recessed amount of the substrate pad 6 can be measured using the encoder 236 of the chip bonder 23. The collapsed amount of the bump 4, however, must be taken into account in doing so. That is, since the recessed amount measured by the encoder 236 of the chip bonder 23 includes the collapsed amount of the bump 4, the true recessed amount of the substrate pad 6 is left after subtracting the collapsed amount from the measured recessed amount.

Figure 20:
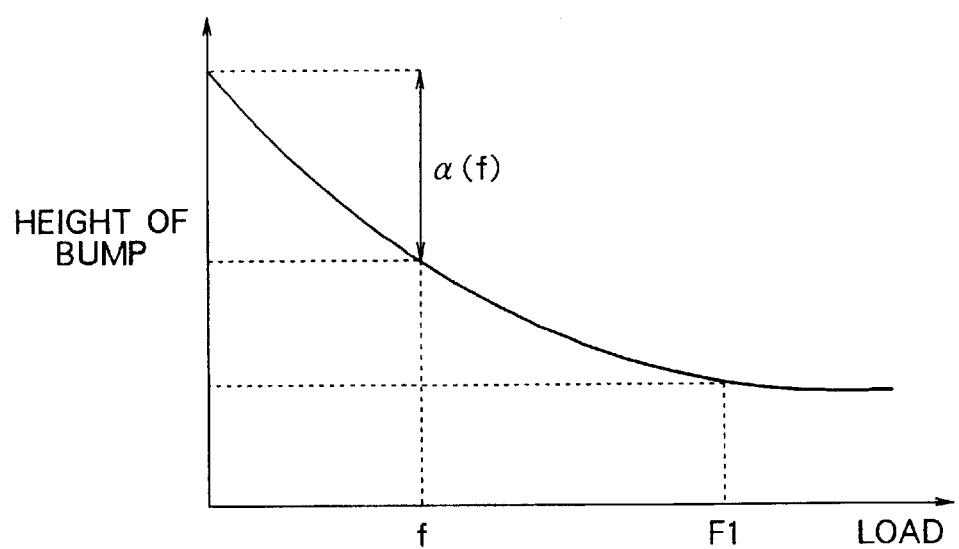
FIG. 20 is a diagram illustrating the relationship between the height and load of the bump.

There can be an arrangement where the correlation between the load exerted on the bump 4 and the height of the bump 4 can be obtained in advance, as shown in FIG. 20, by pushing down the bonding head 234 holding the bare chip 1 toward the substrate 2, and measuring the load at that time with a load cell 235.

The point at which the load cell 235 detects the applied load is set as the starting point, and then the bonding head 234 is further pushed down. At this time, the collapsed amount α(f) of the bump 4 can be obtained based on the correlation shown in FIG. 20 where f represents the load applied to the load cell 235. The recessed amount of the substrate pad 6 can therefore be calculated as the value obtained by subtracting the collapsed amount α(f) from the output value of the encoder 236. Thus, the bonding head 234 is pushed down until the recessed amount thus obtained reaches a predetermined value. By doing this, control can be accomplished so as to make the recessed amount of the substrate pad 6 constant.

The preferred embodiment adopts an arrangement where when recessing the substrate pad 6, the bump 4 is also deformed. There can be, however, another arrangement where a load ($F_1$ in FIG. 20) at which the bump 4 is not deformed any further is obtained in advance, and the load $F_1$ is applied to the bump 4 of the bare chip 1 to keep the bare chip 1 from being deformed further, and then the bare chip 1 is set on the chip bonder 23. By doing so, control can be achieved to make the recessed amount of the substrate pad 6 constant merely by observing the encoder 236 of the chip bonder 23.

Furthermore, the preferred embodiment employs an arrangement where the substrate pad 6 is recessed to a predetermined value at a stretch. When recessing the substrate pad 6 of a substrate 2 having a high elastic modulus, a large load is needed to obtain the predetermined recessed amount. In that case, there can be another arrangement in which the substrate pad 6 is recessed to a certain degree during the adhesive heating period when the substrate temperature remains low, and the substrate pad 6 is recessed to the final recessed amount taking advantage of the fact that the elastic modulus of the substrate 2 lowers as the temperature rises before the adhesive begins hardening. With this arrangement, the effect of removing the voids contained in the adhesive can also be expected.

Next, a description will be made on how the semiconductor device 10 shown in FIG. 1 accomplishes high reliability, based on the results of tests conducted to verify the validity of the semiconductor device 10 of FIG. 1.

Figures 21, 22:
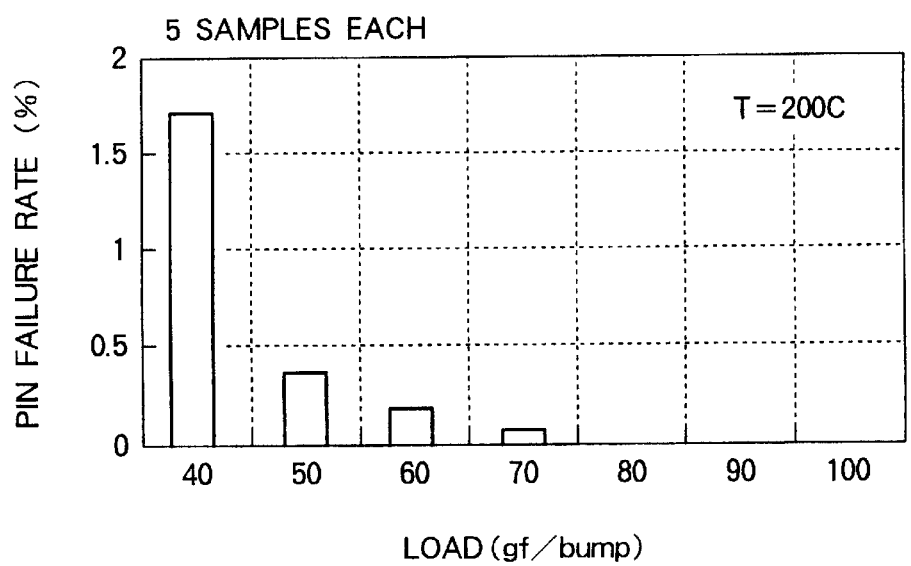
FIG. 21 is a diagram of the LSI chip and the substrate used in the test.
FIG. 22 is a diagram illustrating the results of the PCT test.

The tests were conducted in accordance with so-called temperature cycling tests (TCTs) and pressure-cooker tests (PCTs) on a plurality of the semiconductor devices 10 of FIG. 1 manufactured by the method of manufacturing the semiconductor device of FIG. 8 using bare-chips 1 and substrates 2 having conditions given in FIG. 21. As the substrate 2, FR-4 (ANSI grade) was used, with the width of the substrate pad 6 being approximately 50 μm. FIGS. 22 through 26 show the test results.

FIG. 22 shows the test results obtained by measuring the failure rates of electrical connection of the chip pads 3 (the ratio of the chip pads 3 which caused faulty connections) when five semiconductor devices 10 were placed in an environment kept at a temperature of 105° C., a relative humidity of 100% and a pressure of 1.2 atm for 72 hours. These five semiconductor devices 10 are manufactured by applying the loads which are set to be applied to the bare chip 1 to 40 g, 50 g, 60 g, 70 g, 80 g, 90 g and 100 g per bump 4. In these tests, the adhesive 7 was hardened by heating the bonding head 234 of the chip bonder 23 to 200° C.

As is evident from the test results shown in FIG. 22, the failure rate of electrical connection of the chip pad 3 decreases with increases in the load applied to the bare chip 1. This is attributable to the fact that with increases in the load applied to the bare chip 1, the recessed amount of the substrate pad 6 substrate 2 increases, making electrical connection between the bump 4 and the substrate pad 6 more positive and reliable.

Also as is evident from FIG. 22, reliable electrical connection can be ensured with a load more than 80 g per bump 4. Consequently, the load applied to the bare chip 1 should be a predetermined value more than 80 g per bump 4, and more preferably be a approximately 90 g per bump 4 to provide allowances for ensuring more positive electrical connection and minimize the effects of load on other parts.

Figure 23:
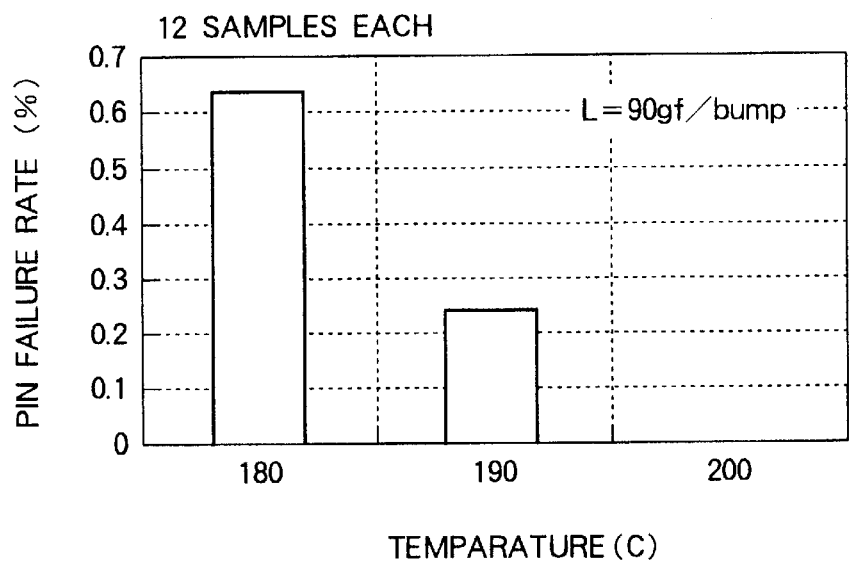
FIG. 23 is a diagram illustrating the results of the PCT test.

FIG. 23 shows the results of tests conducted by measuring the failure rate of electrical connection of the chip pad 3 when 12 pieces of the semiconductor devices 10 were placed in an environment kept at a temperature of 105° C., a relative humidity of 100% and a pressure of 1.2 atm for 72 hours. These 12 pieces of the semiconductor devices 10 are manufactured at the temperatures which are set the heating temperature of the bonding head 234 used for hardening the adhesive 7 at 180° C., 190° C. and 200° C. In these tests, the load applied to the bare chip 1 was set at 90 g per bump 4.

As is evident from the test results shown in FIG. 23, the failure rate of electrical connection of the chip pad 3 decreases with increases in the heating temperature of the bonding head 234. This is attributable to the fact that with increases in the heating temperature of the bonding head 234, the substrate 2 becomes softer and the recessed amount of the substrate pad 6/substrate 2 increases, making electrical connection between the bump 4 and the substrate pad 6 more positive and reliable.

As is obvious from FIG. 23, positive electrical connection can be ensured at heating temperatures above 190° C. Consequently, the heating temperature of the bare chip 1 should be a predetermined value above 190° C., and preferably be a heating temperature of approximately 200° C. to provide allowances for ensuring more positive electrical connection and minimize the effects of load on other parts.

Figure 24:
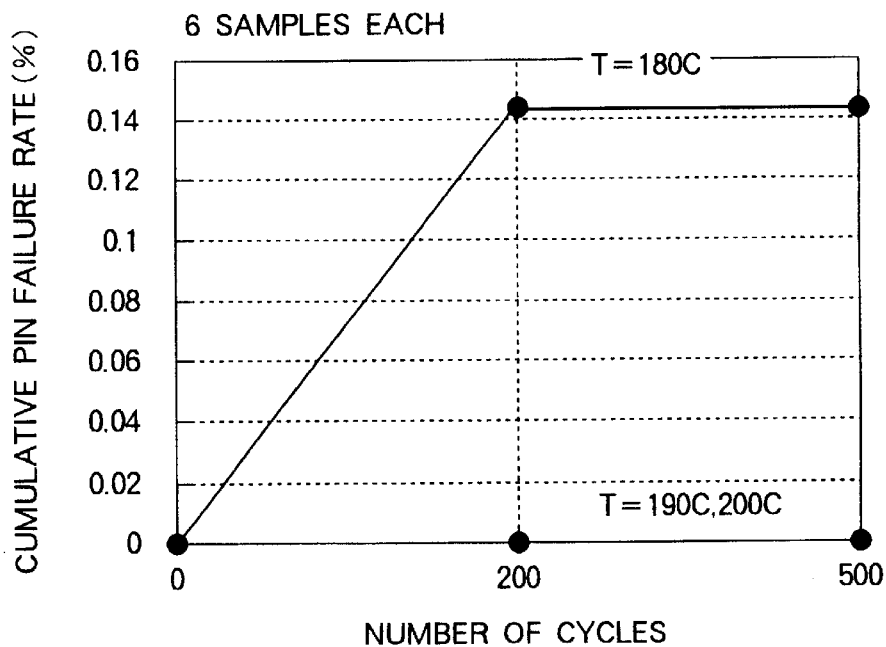
FIG. 24 is a diagram illustrating the results of the PCT test.

FIG. 24 shows the results of tests conducted by measuring the cumulative failure rate of electrical connection of the chip pad 3 when 6 pieces of the semiconductor devices 10 were subjected to 500 temperature cycles (a cycle consists of minus (−) 40° C. for 15 min. and 100° C. for 15 min). These six pieces of the semiconductor devices 10 are manufactured at the heating temperatures which are set the heating temperature of the bonding head 234 used for hardening the adhesive 7 at 180° C., 190° C. and 200° C. In these tests, the load applied to the bare chip 1 was set at 90 g per bump 4.

As is obvious from the test results shown in FIG. 24, when the heating temperature of the bonding head 234 exceeds 190° C., no failures occur in the electrical connection of the chip pad 3 even after subjecting the semiconductor devices 10 to the temperature cycles. This is attributable to the fact that with increases in the heating temperature of the bonding head 234, the substrate 2 becomes softer and the recessed amount of the substrate pad6/substrate 2 increases, making electrical connection between the bump 4 and the substrate pad 6 more positive and reliable.

Figures 25, 26:
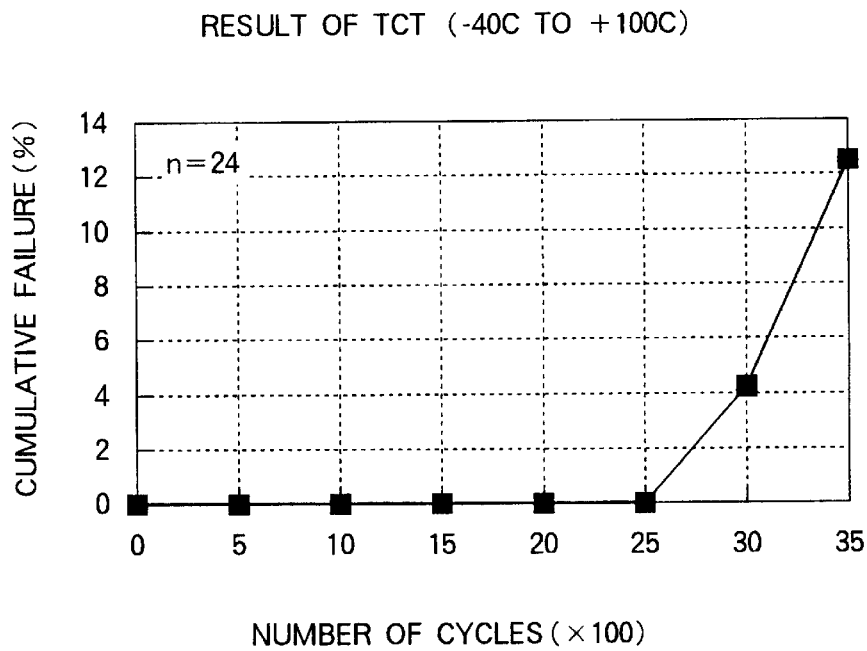
FIG. 25 is a diagram illustrating the results of the PCT test.
FIG. 26 is a diagram illustrating the results of other tests.

FIG. 25 shows the results of tests conducted by measuring the cumulative failure rate of electrical connection of the chip pad 3 when 24 pieces of the semiconductor devices 10 were subjected to 3,500 temperature cycles mentioned above. These 24 pieces each of the semiconductor devices 10 are manufactured at the set values which are set the heating temperature of the bonding head 234 used for hardening the adhesive 7 at 200° C. and set the load applied to the bare chip 1 at 90 g per bump 7.

The test results shown in FIG. 22 reveal that a load of 90 g per bump 4 is sufficient for the load applied to the bare chip 1, and the test results shown in FIGS. 23 and 24 indicate that a temperature of 200° C. suffices for the heating temperature of the bonding head 234 used to hardening the adhesive 7. The tests shown in FIG. 25 were conducted based of these test results to verify the long-term reliability of the semiconductor device 10 of this invention manufactured at the load applied to the bare chip 1 of 90 g per bump 4 and the heating temperature of bonding head 234 of 200° C. The recessed amount of the substrate pad 6/substrate 2 on the semiconductor device 10 of this invention manufactured in the aforementioned manner was about 10 μm.

Empirically, the semiconductor devices in which no failures occur when subjected to about 500 temperature cycles are considered involving no problems. The test results shown in FIG. 25, on the other hand, reveal that no failures occur in the semiconductor devices 10 even after subjected to 2,500 temperature cycles. It was confirmed from these test results that the semiconductor devices 10 of this invention manufactured at the heating temperature of the bonding head 234 of 200° C. and the load applied to the bare chip 1 of 90 g per bump 4 have high reliability over a long period.

FIG. 26 shows the followings: one is the results of tests confirming that no failures occurred with 24 pieces of the semiconductor devices 10 of this invention placed in an environment kept at a temperature of 85° C. and a relative humidity of 85% for 3,500 hours (they are still under test at this writing for a period exceeding 4,000 hours), another is the results of tests confirming that no failures occurred with six pieces of the semiconductor devices 10 of this invention, with a 3% warp given to the substrates 2, placed at a temperature of 100° C. for 2,000 hours (they are still under test at this writing for a period exceeding 3,000 hours), still another is the results of tests confirming that no failures occurred with six pieces of semiconductor devices 10 when subjected to a reflow of nitrogen gas 12 times, further is the results of tests confirming that no failures occurred with three pieces of the semiconductor devices 10 when subjected to an acceleration of 15 G or an amplitude of 1.52 mm in the three-dimensional direction at a frequency of 10 Hz–2 kHz, and last is the results of tests confirming that no failures occurred with three pieces of the semiconductor devices 10 when subjected to an impact of 50 G for 11 msec in accordance with the MIL standard.

All the semiconductor devices 10 used in these tests were manufactured at the heating temperature of the bonding head 234 of 200° C. and the load applied to the bare chip 1 of 90 g per bump 4.

It was verified from the test results shown in FIGS. 22 through 26 that the semiconductor devices 10 shown in FIG. 1 achieve high reliability.

Next, the semiconductor device 10 having a different structure from that shown in FIG. 1 will be described.

Figure 27:
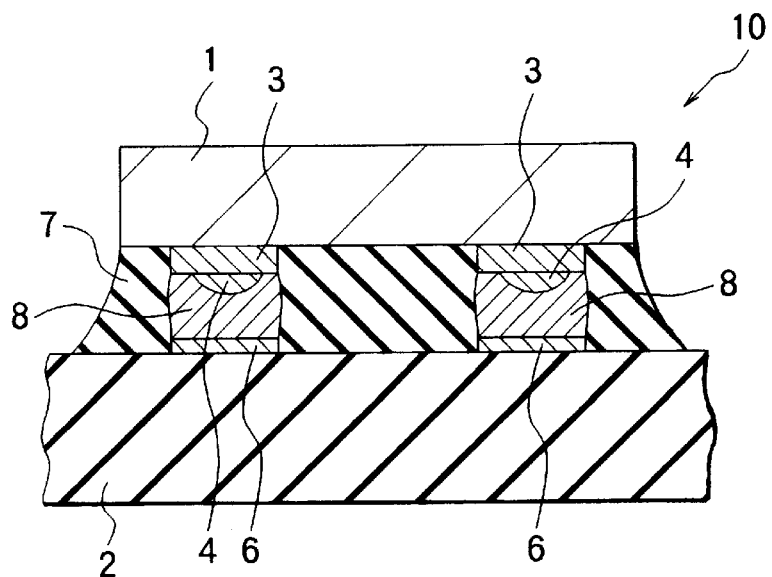
FIG. 27 is a partially enlarged sectional view of an example illustrating the another structure of this invention.

FIG. 27 shows a preferred embodiment of the semiconductor device 10 according to the present invention having such a structure. In FIG. 27, like parts are indicated by like numerals used in FIG. 1.

The semiconductor device 10 of this invention shown in FIG. 27 has such a structure that a conductive elastic member 8 is disposed on the substrate pad 6 at a location corresponding to the chip pad 3, and a bump 4 that is forced onto the conductive elastic member 8 is disposed on the chip pad 3.

The semiconductor device 10 can be manufactured by forming the bump 4 on the chip pad 3, forming the conductive elastic member 8 on the substrate pad 6, applying adhesive at a location of the substrate at which the bare chip 1 is to be placed, pressing the bare chip 1 onto the substrate 2 while forcing the bump 4 onto the conductive elastic member 8, and causing the applied adhesive to harden while the bare chip 1 is forced onto the substrate 2.

Figure 28:
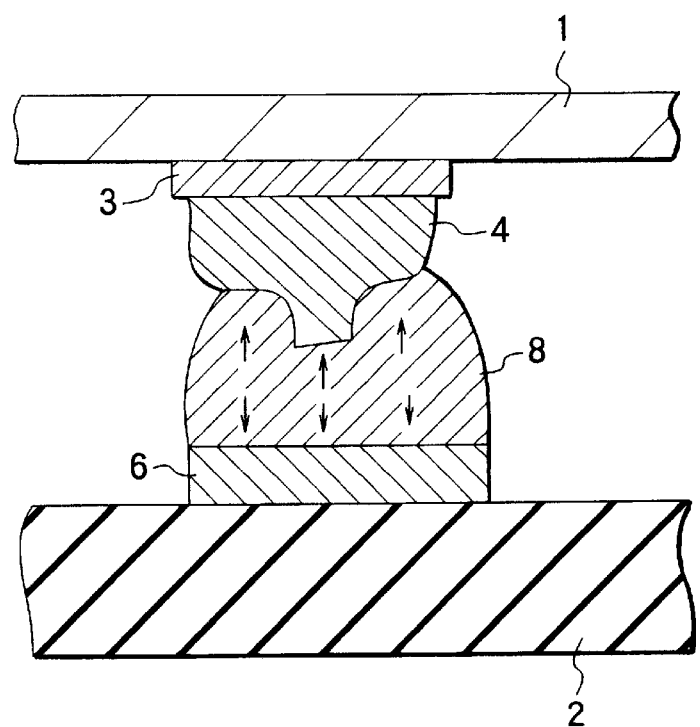
FIG. 28 is a partially enlarged sectional view of this invention.

Since the conductive elastic member 8 has electric conductivity and elasticity in the semiconductor device 10, even if the bare chip 1 is displaced in a direction away from the substrate 2, the elastically deformed conductive elastic member 8 tends to restore its original shape, as shown in FIG. 28, causing the bump 4 to positively and closely enmesh with the conductive elastic member 8. This makes it possible to ensure positive electrical connection between the chip pad 3 and the substrate pad 6 without using conductive paste and leveling the bump 4.

Furthermore, even if a lateral shift occurs between the bare chip 1 and the substrate 2 due to the difference in thermal expansion coefficients of the bare chip 1 and the substrate 2, the conductive elastic member 8 tends to restore its original shape, causing the bump 4 to positively and closely enmesh with the conductive elastic member 8, making it possible to ensure positive electrical connection between the chip pad 3 and the substrate pad 6 without using conductive paste and leveling the bump 4.

Furthermore, by forming the conductive elastic member 8 into a concave or convex shape, the contact area between the bump 4 and the conductive elastic member 8 increases, making electrical connection between the chip pad 3 and the substrate pad 6 even more positive.

Figure 29:
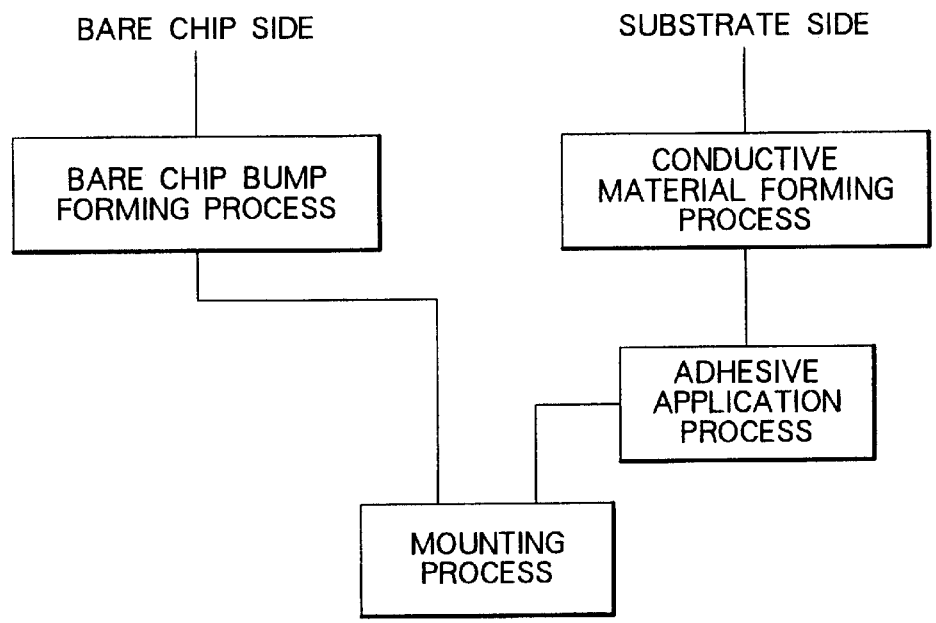
FIG. 29 shows an embodiment of this invention.

FIG. 29 shows a preferred embodiment of a manufacturing method of the semiconductor device 10 shown in FIG. 27.

When manufacturing the semiconductor device 10 shown in FIG. 27, the bump 4 is first formed on the chip pad 3 of the bare chip 1 using the bump bonder 20. In parallel with the formation of the bump 4, the conductive elastic member 8 is formed on the substrate pad 6 of the substrate 2.

Figure 30:
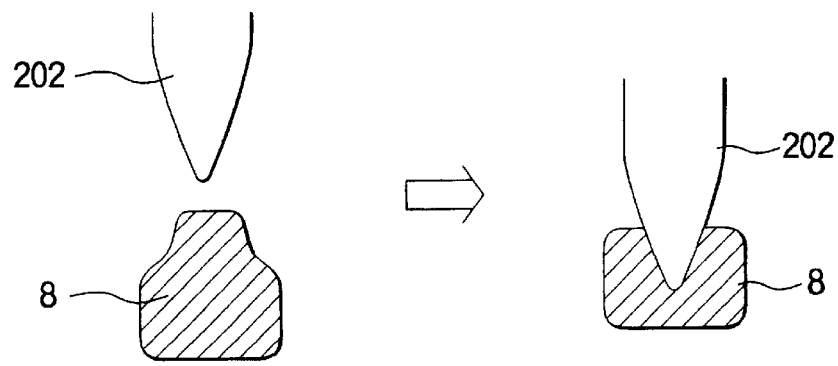
FIG. 30 shows another embodiment of this invention.

The conductive elastic member 8 is formed by bonding a highly ductile metal, such as gold, to the substrate pad 6 by wire bonding or welding, using the bump bonder 20, for example, as shown in FIG. 30, and then forming the top surface thereof into a concave shape by pressing it with a capillary or wedge, or bonding a conductive rubber having a concave shape to the substrate pad 6.

Figure 31A:
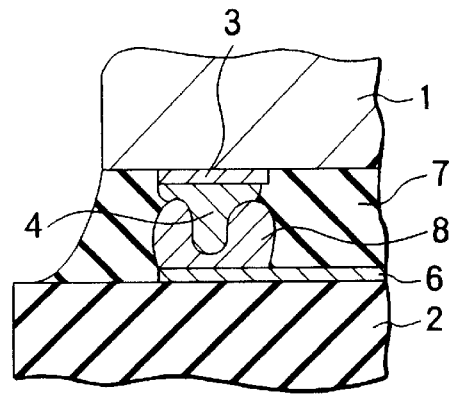
FIGS. 31A, 31B and 31C are partially enlarged sectional views of an electrically conductive elastic body.
Figure 31B:
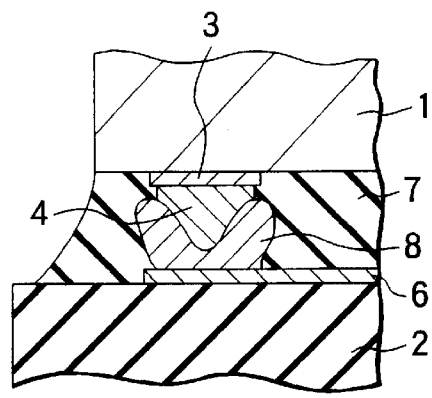
Figure 31C:
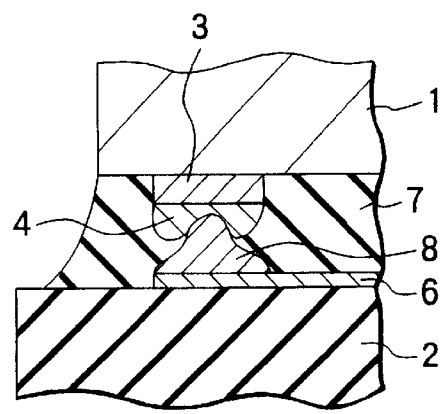

The conductive elastic member 8 is formed into a concave shape to obtain a wide contact area. When the bump 4 is of a convex shape, therefore, the conductive elastic member 8 is formed into a concave shape as shown in FIG. 31A or a V shape as shown in FIG. 31B. When the bump 4 is of a concave shape, on the other hand, the conductive elastic member 8 is formed into a convex shape as shown in FIG. 31C.

Upon forming the conductive elastic member 8, adhesive 7 is applied to the substrate 2 using the dispenser 21.

After the bump 4 has been formed on the chip pad 3 of the bare chip 1, the conductive elastic member 8 has been formed on the substrate pad 6 of the substrate 2 and adhesive 7 has been applied to the substrate 2, the bare chip 1 is then mounted on the substrate 2 while the bump 4 is forced onto the conductive elastic member 8, and the adhesive 7 is hardened by heating, and after that, the load is released to complete the semiconductor device 10 shown in FIG. 27.

In this way, the semiconductor device 10 shown in FIG. 27 can be manufactured with high productivity without using conductive paste or leveling the bumps 4. The semiconductor device 10 shown in FIG. 27 can be manufactured using leveling the bumps 4.

With the semiconductor device 10 shown in FIG. 27 manufactured in this way, even if the bare chip 1 is displaced in a direction away from the substrate 2, the bump 4 is kept in close contact with the conductive elastic member 8 since the elastically deformed conductive elastic member 8 tends to restore to its original shape. As a result, electrical connection between the chip pad 3 and the substrate pad 6 can be positively maintained without using conductive adhesive.

Furthermore, even if a lateral shift is caused between the bare chip 1 and the substrate 2 due to the difference between the thermal expansion coefficients of the bare chip 1 and the substrate 2, the bump 4 is kept in close contact with the conductive elastic member 8 since the elastically deformed conductive elastic member 8 tends to restore to its original shape. As a result, electrical connection between the chip pad 3 and the substrate pad 6 can be positively maintained, irrespective of temperature changes.

Figure 32A:
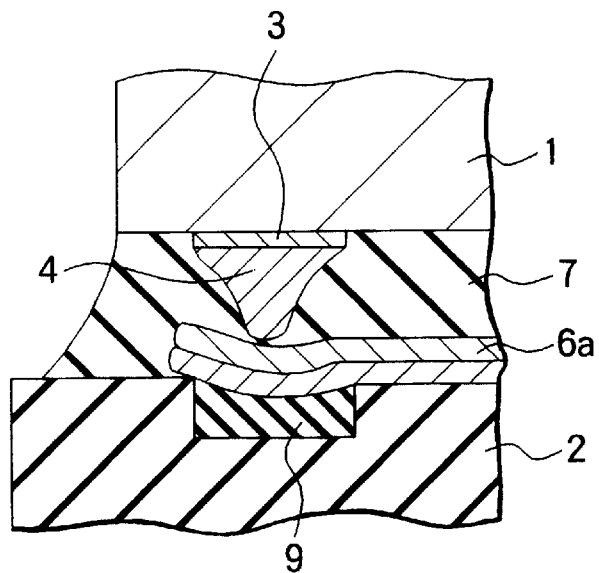
FIGS. 32A and 32B are partially enlarged sectional views of still another embodiment of this invention.

In the manufacturing method shown in FIG. 29, the conductive elastic member 8 is formed on the substrate pad 6 of the substrate 2. There can be, however, another arrangement where an elastic member 9 made of rubber, resin or other material is disposed at a location on the substrate 2 corresponding to the bump 4, a flexible substrate 6a is used as the substrate pad 6, and the bare chip 1 is bonded to the substrate 2 in flip-chip bonding by forcing the bump 4 onto the flexible substrate 6a without using conductive paste, as shown in FIG. 32A. This arrangement can also achieve the same effect.

This arrangement can be applied to the bump 4 having either a convex or concave shape, and the elastic member 9 and the flexible substrate 6a are formed without forming the conductive elastic member 8. In this arrangement, the shape of the flexible substrate 6a should preferably be such as to match with the shape of the bump 4 using heating and bending process to increase the bonding area between the bump 4 and the flexible substrate 6a.

Figure 32B:
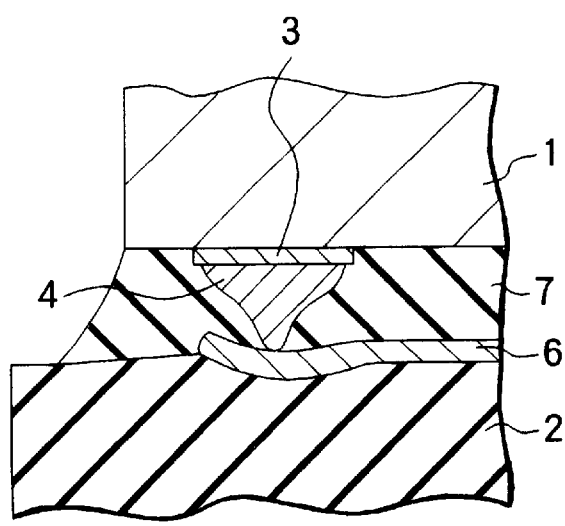
Figure 33:
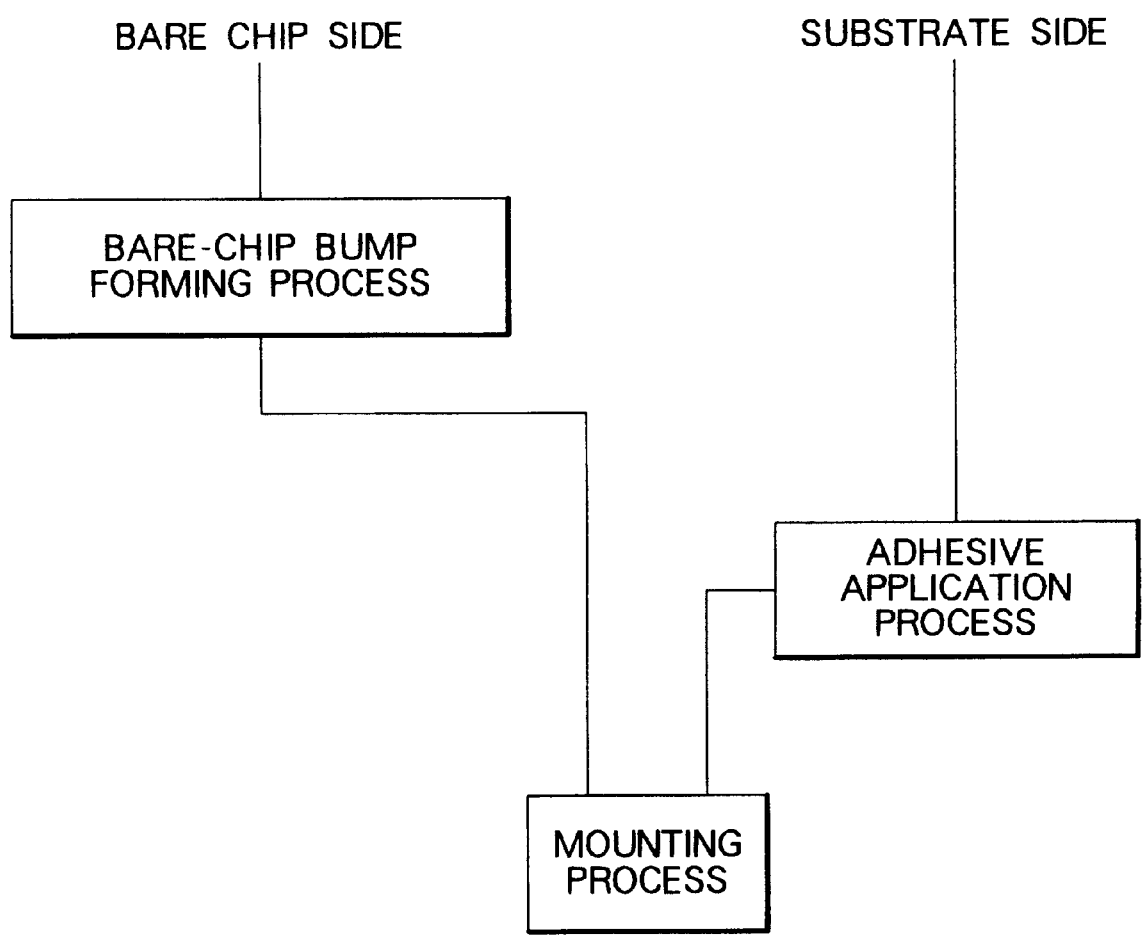
FIG. 33 shows a further embodiment of this invention.

In the manufacturing method shown in FIG. 29, the conductive elastic member 8 is formed on the substrate pad 6 of the substrate 2. There can be, however, another arrangement where the bare chip 1 is bonded to the substrate 2 in flip-chip bonding without using conductive paste by forcing the bump 4 onto the substrate pad 6 using the resiliency of the substrate pad 6, instead of forming the conductive elastic member 8, as shown in FIG. 32B. This arrangement can also achieve the same effect. With this arrangement, the semiconductor device 10 can be manufactured by forming the bump 4 on the chip pad 3 of the bare chip 1, applying adhesive to the substrate 2, mounting the bare chip 1 on the substrate 2 by forcing the bare chip 1 onto the substrate 2 and hardening the adhesive by heating.

This arrangement should preferably be applied to the bump 4 of a convex shape. The substrate 2 to be used with this arrangement should preferably be of a type having high elastic deformability, and more specifically a material containing less glass fibers and more resin ingredient, with the resin having a glass transition temperature higher than the thermosetting temperature of the adhesive, a low thermal expansion coefficient and high dimensional stability at the thermal hardening of the adhesive.

Figure 34A:
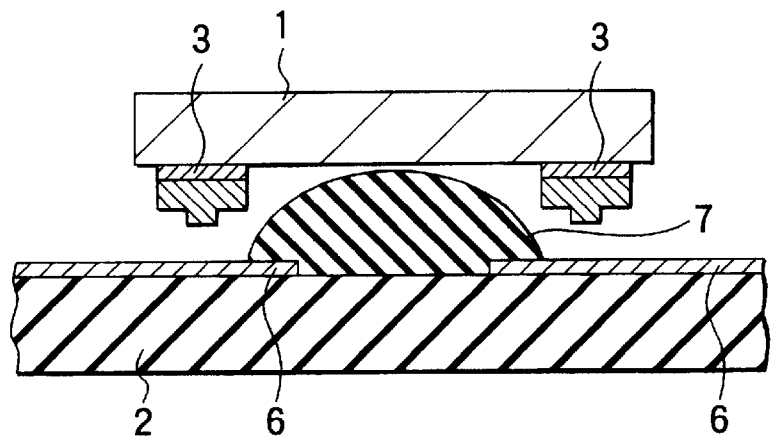
FIGS. 34A, 34B and 34C are diagrams summarizing the mounting process of an embodiment of this invention.
Figure 34B:
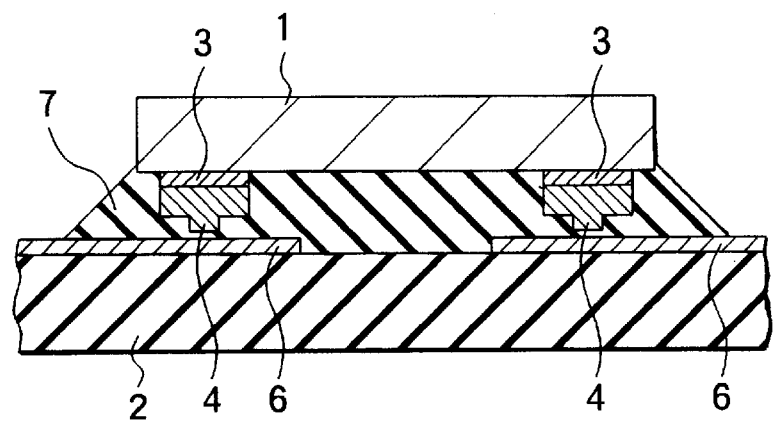
Figure 34C:
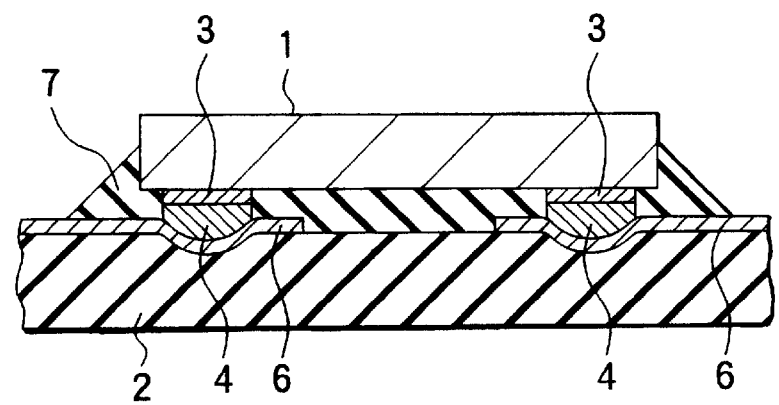

FIGS. 34A through 34C are conceptual diagrams illustrating a mounting process in the manufacture of semiconductor devices described above. Like numerals indicate like parts shown in FIG. 1. That is, the adhesive 7 is provided in between the bare chip 1 on which the bump 4 is formed and the substrate 2, as shown in FIG. 34A. Then, the bare chip 1 is positioned properly on the substrate 2 and forced onto the substrate 2, as shown in FIG. 34B. At this time, the bare chip 1 is forced onto the substrate 2 while heat is applied to the entire assembly.

On application of pressure and heat, a recess is formed on the substrate pad 6 of the substrate 2 as shown in FIG. 34C, so that the bump 4 is engaged with the recess on the substrate 2. As the adhesive 7 is hardened in this state, the substrate 2 and the bare chip 1 are integrally bonded.

In the manufacture of semiconductor devices as described above, the formation of a recess on the substrate pad 6 of the substrate 2 and the hardening of the adhesive 7 are carried out simultaneously while the bare chip 1 is forced onto the substrate 2.

Although the mounting process as described in FIGS. 34A through 34C is off course sufficiently desirable per se, the aforementioned recess should preferably be provided by heating the resin on the substrate pad 6 to a temperature exceeding the glass transition temperature. If the glass transition temperature of the substrate 2 is high, the temperature at which the substrate 2 is heated to provide a recess on the substrate pad 6 might exceed the allowable temperature of the adhesive 7. This could make it impossible to obtain desired characteristics.

Figure 35A:
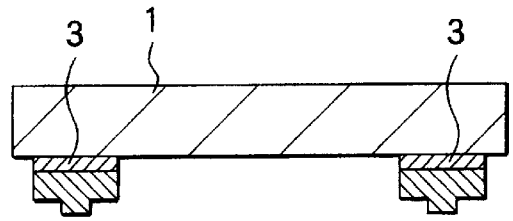
FIGS. 35A, 35B, 35C and 35D show another embodiment of this invention.
Figure 35B:
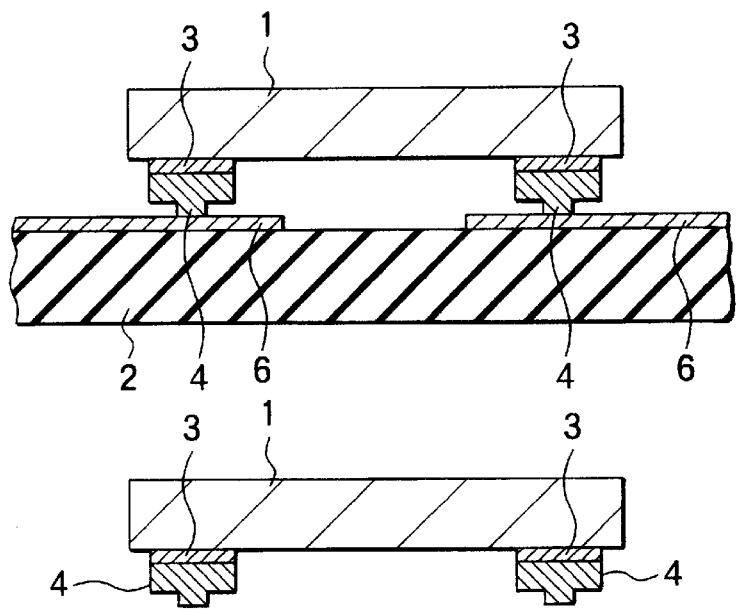
Figure 35C:
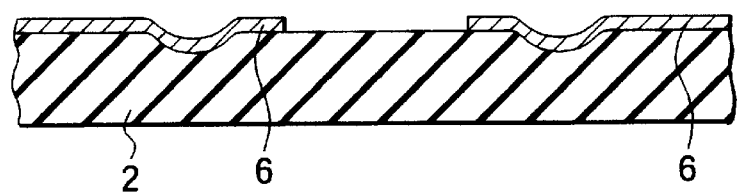

Taking this point into account, the mounting process shown in FIGS. 34A through 34C has been modified as shown in FIGS. 35A through 35C in this invention.

That is, the bare chip 1 having the bump 4 formed thereon is lowered while positioning it on a predetermined location on the substrate 2, as shown in FIG. 35A. The bare chip 1 is then forced onto the substrate 2 while heating to a temperature at which the elasticity of the substrate lowers, such as 250° C., as shown in FIG. 35B, so as to form a recess on the substrate pad 6, as shown in FIG. 35C.

Figure 35D:
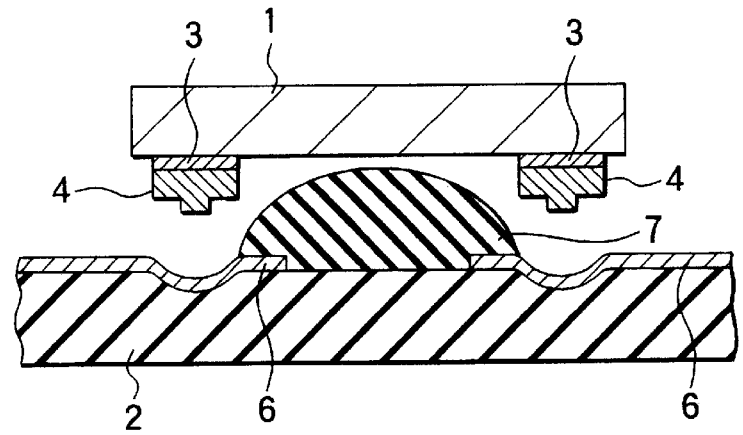

In a state where a recess has been formed on the substrate pad 6, the bare chip 1 is temporarily lifted, as shown in FIG. 35C. Then, the adhesive 7 is provided in between the bare chip 1 and the substrate 2, the bump 4 is positioned so that the bump 4 is engaged with the recess on the substrate pad 6, and the bare chip 1 is forced onto the substrate 2, as shown in FIG. 35D. The adhesive 7 is then hardened by heating to a predetermined adhesive hardening temperature, such as 180° C. The structure after the adhesive 7 has been hardened in the aforementioned manner is essentially the same as that shown in FIG. 34C.

In the mounting process shown in FIGS. 35A through 35D, the temperature for hardening the adhesive 7 can be maintained properly since the application of heat to form a recess is carried out separately from the application of heat to harden the adhesive 7.

According to a preferred embodiment of the present invention, a mounting process can be employed which has been further improved as will be shown in the following.

That is, in a recess forming process as shown in FIG. 35B, a recess is formed by using the bare chip 1 which is to be integrally bonded to the substrate 2 in the process shown in FIG. 35D. To form a recess separately as mentioned earlier, however, a jig 24 that is adapted to form a desired recess can be used in the process shown in FIG. 35B, instead of using the bare chip 1.

Figure 36A:
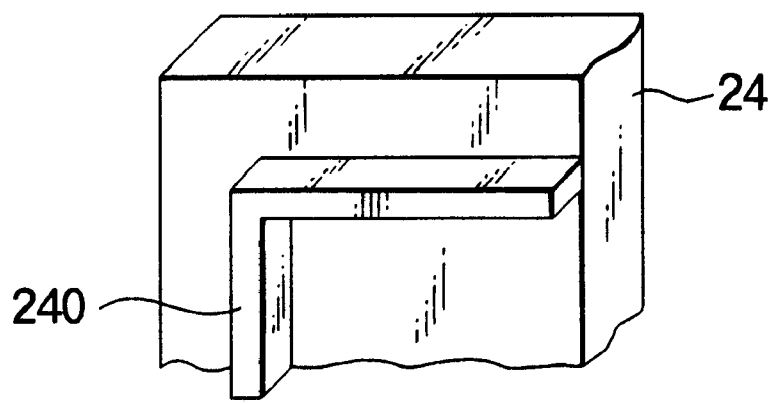
FIGS. 36A and 36B are diagrams illustrating a jig used in this invention and the method of using it.

FIG. 36A shows a jig 24 having a projection with a predetermined ridge, and FIG. 36D is a diagram of assistance in explaining the state where the projection 240 of the jig 24 comes in contact with the substrate pads 6 of the substrate 2.

Figure 37A:
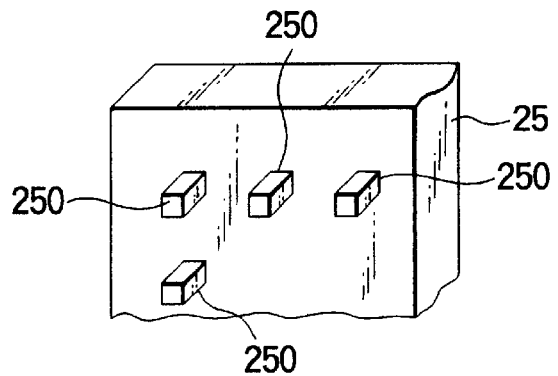
FIGS. 37A, 37B and 37C are diagrams illustrating another jig used in this invention and the method using it.
Figure 37B:
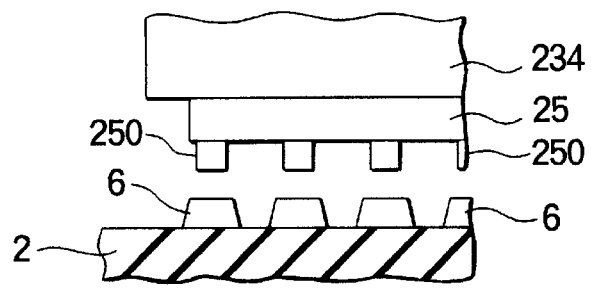
Figure 37C:
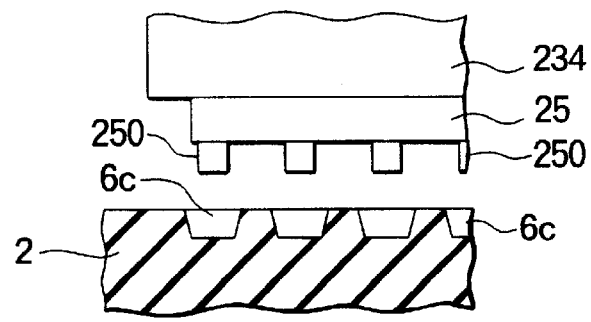

FIG. 37A shows a jig 25 having projections 250 disposed at certain intervals, and FIG. 37B is a diagram of assistance in explaining the state where the projections 250 of the jig 25 come in contact with the substrate pads 6 of the substrate 6. FIG. 37C shows the state where the projections 250 of the jig 25 come in contact with the substrate pads 6 embedded in the substrate 2.

Furthermore, the following advantages are brought about by using the jigs 24 and 25 for forming recesses, as described above; in the mounting process shown in FIGS. 35A through 35D, the heating temperature in the recess forming process shown in FIG. 35B is different from the heating temperature in the adhesive hardening process shown in FIG. 35D, as a result, the bare chip 1 and the substrate 2 have to be first heated to 250° C., for example, then temporarily cooled to normal temperatures, and then heated again to 180° C. The use of the jigs 24 and 25 to form recesses as described above, however, makes it possible to form recesses one after another while keeping the temperature of the jigs 24 and 25 at 250° C. and bond the bare chip 1 to the substrate 2 as shown in FIG. 35D in a state where the substrate 2 on which recesses have been formed is moved to a different location. Thus, the time for raising and lowering the temperature can be substantially reduced, unlike the mounting process shown in FIGS. 35A through 35D where the temperature has to be first raised and then lowered.

In the mounting process shown in FIGS. 35A through 35D, the substrate 2 and the bare chip 1 should preferably be heated in advance to a desired temperature prior to the application of pressure to the bare chip 1 to form recesses on the substrate pads 6, as shown in FIG. 35B. By doing this, time can be saved, compared with the application of heat while exerting pressure.

When raising the temperature of the bare chip 1 as in the case of FIG. 35C, it is not necessary to wait until the substrate 2 is cooled to a temperature at which the recesses formed on the substrate pad 6 are no longer unwantedly returned to the original shape. Even when the pushing force is removed without waiting until the bare chip 1 is cooled, the predetermined recess can be retained though part of the formed recess may be restored to some extent because a recess is produced on the substrate 2 itself. Removing the pushing force in early stages in this way would be effective in reducing manufacturing time.

In the hardening process where the bare chip 1 is forced onto the substrate 2, the pushing force need not be continuously applied to the bare chip 1 until the adhesive is completely hardened. Since the positioning of the substrate 2 and the bare chip 1 requires an expensive apparatus (such as a flip-chip bonder) to ensure accurate positioning, it would not be desirable to continue to use such an expensive apparatus until the adhesive is hardened.

Where a recess is provided on the substrate 2, the pushing force exerted by using that expensive apparatus can be removed, and the remaining hardening can be completed in a separate process. No unwanted positioning deviation would occur during adhesive hardening in a separate process. This is partly because the presence of a recess ensures the engagement of the recess on the substrate 2 with the bump, and partly because the viscosity of the adhesive is kept above a certain level.

Figure 38:
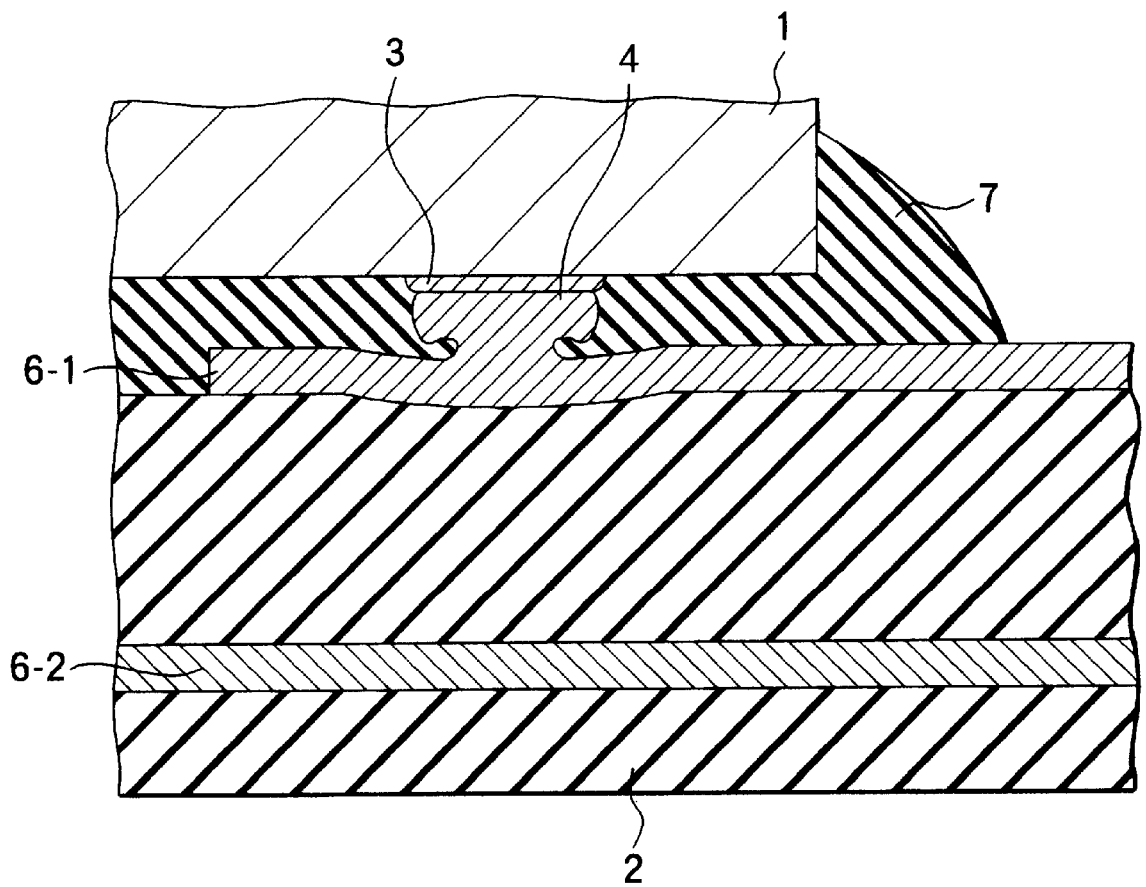
FIG. 38 is a cross-sectional view illustrating the actual state where the recessed portion according to this invention is bonded.
Figure 39:
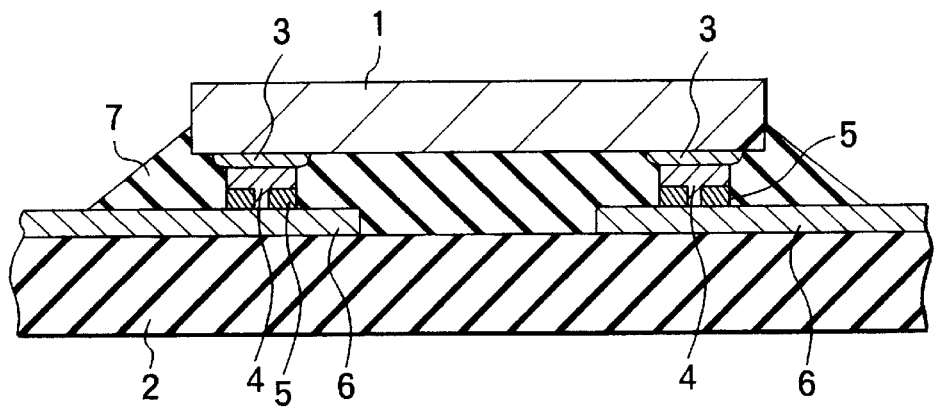
FIG. 39 is a sectional view of the prior art.
Figure 40:
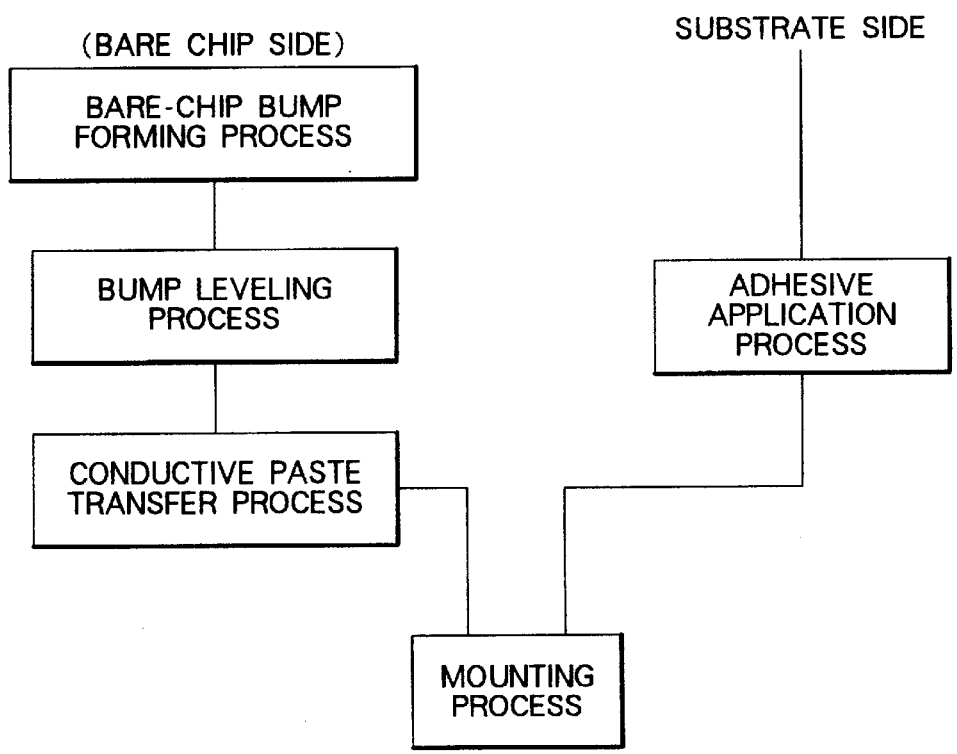
FIG. 40 is a diagram of the prior art.
Figure 23:
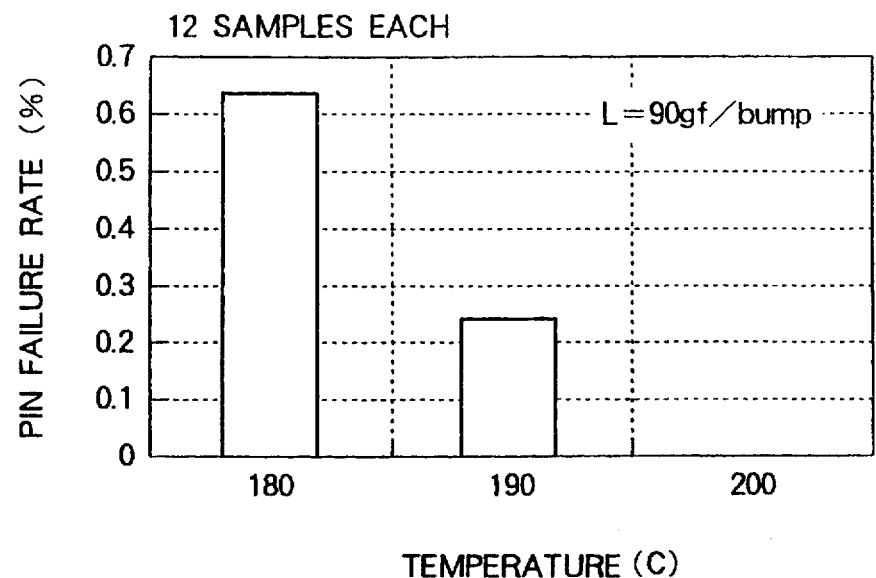
Figure 24:
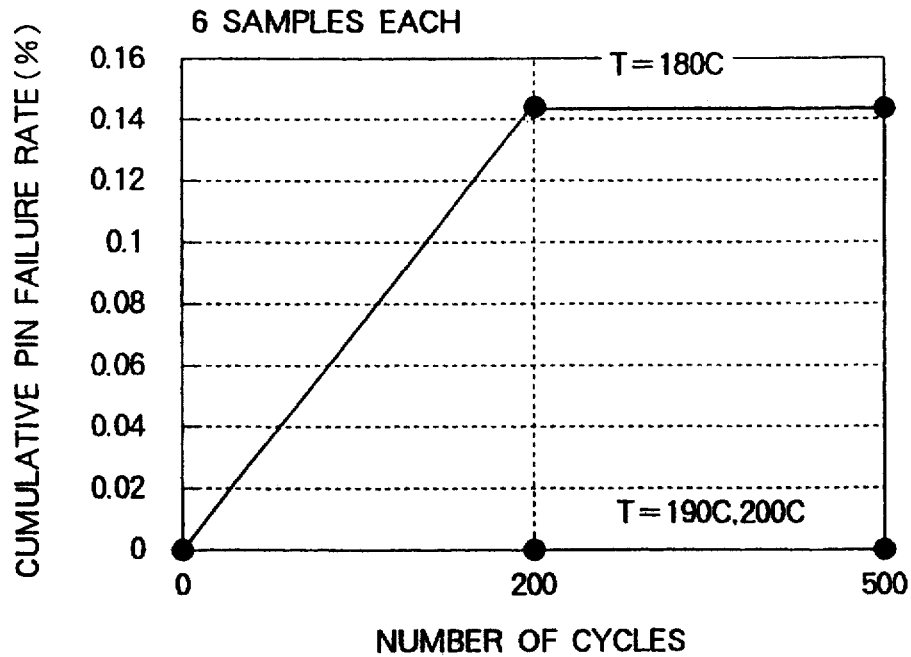

FIG. 38 is a cross-sectional view illustrating the actual state where the recessed portion is bonded to the bare chip 1. A recess is produced on the substrate pad 6-1 at a location at which the bump 4 exists, and a certain length of the substrate pad 6-1 is warped downward. The bump 4 is embedded in the recess itself for electrical connection.

In the foregoing, this invention has been described, referring to the embodiments shown in the accompanying drawings, but this invention is not limited to them. In the embodiments, for example, adhesive of thermosetting type is used for bonding the bare chip 1 to the substrate 2. The present invention, however, is not limited to that type of adhesive. Adhesive of UV-setting type can also be used satisfactorily.

As described above, the semiconductor device according to the present invention can be manufactured with high productivity and reliability while ensuring positive electrical connection between the bare chip and the substrate since it can be manufactured without using conductive paste when bonding a bare-chip component, or a bare chip, to a printed circuit board, or a substrate, in flip-chip bonding technology.

What is claimed is:

1. A manufacturing method of a semiconductor device comprising a bare chip having a plurality of chip pads and a substrate having a plurality of substrate pads, said method comprising:

a recess forming step for forming a recess by exerting a pushing force at a location of a substrate pad of said substrate corresponding to one or a plurality of chip pads of said bare chip;

an adhesive coating step for applying adhesive to a location of said substrate at which said bare chip is disposed;

a bare chip mounting step for placing said bare chip on said substrate by positioning bumps formed on said chip pads of said bare chip on said substrate pad of said substrate; and an adhesive hardening step for hardening said applied adhesive.

2. A manufacturing method of a semiconductor device according to claim 1, further comprising:

a composite step for placing said bare chip on said substrate to which said adhesive has been applied while positioning said bumps on said substrate pads of said substrate, forcing said placed bare chip onto said substrate until each of said substrate pads of said substrate is recessed, and hardening said applied adhesive during said pushing process, wherein after said adhesive coating step, said recess forming step, said bare chip mounting step, and said adhesive hardening step are carried out simultaneously in said composite step.

3. A manufacturing method of a semiconductor device according to claim 1, wherein said recess is formed on said substrate pads in said recess forming step by forcing said bare chip on which said bumps have been formed onto said substrate pads, and wherein said adhesive coating step, said bare chip mounting step, and said adhesive hardening step are sequentially carried out after said recess forming step.

4. A manufacturing method of a semiconductor device according to claim 1, wherein said recess is formed on said substrate pads in said recess forming step using a jig having projections corresponding to locations of said bumps of said bare chip, and forcing said jig onto said substrate pads of said substrate, and wherein said adhesive coating step, said chip mounting step, and said adhesive hardening step are sequentially carried out after said recess forming step.

5. A manufacturing method of a semiconductor device according to claim 4, wherein said jig includes a projection having a ridge of a predetermined length, and is forced onto said substrate pads of said substrate.

6. A manufacturing method of a semiconductor device according to claim 4, wherein said jig includes a plurality of projections arranged at certain intervals, and is forced onto said substrate pads of said substrate.

7. A manufacturing method of a semiconductor device according to claim 4, wherein said jig is kept at a high temperature so that said jig is prevented from cooling below a predetermined temperature between recess forming steps using said jig.

8. A manufacturing method of a semiconductor device according to claim 1, wherein a pushing force is exerted after said substrate is heated above a temperature at which an elasticity modulus of said substrate is lowered in said recess forming step, and then said substrate is cooled.

9. A manufacturing method of a semiconductor device according to claim 8, wherein said substrate is heated before said pushing force is applied.

10. A manufacturing method of a semiconductor device according to claim 8, wherein a pushing force is removed from said substrate before said cooling is completed.

11. A manufacturing method of a semiconductor device according to claim 1, wherein said bare chip is placed on said substrate under pressure in said bare chip mounting step, and said adhesive hardening step is carried out by applying pressure and heat to harden said adhesive using a process different from said bare chip mounting step.

12. A manufacturing method of a semiconductor device according to claim 1, wherein a material having high elastic deformability is used for said substrate.

13. A manufacturing method of a semiconductor device according to claim 2, wherein said applied adhesive is hardened by by being heated to a predetermined temperature in said composite step.

14. A manufacturing method of a semiconductor device according to claim 4, wherein said substrate is heated above a temperature at which an elasticity modulus of said substrate is lowered in said composite step.

15. A manufacturing method of a semiconductor device according to claim 2, wherein said bare chip is forced onto said substrate with a predetermined pushing force in said composite step.

16. A manufacturing method of a semiconductor device according to claim 2, wherein air bubbles contained in adhesive to be applied in said composite step are removed by rotating said adhesive in a vacuum in said adhesive coating step.

17. A manufacturing method of a semiconductor device according to claim 1, wherein said substrate is heated so that viscosity of said adhesive applied in said adhesive coating step is lowered.

18. A manufacturing method of a semiconductor device according to claim 1, wherein a plurality of locations, including a center point and corner points of areas at which said bare chip is to be placed, are set as locations to which said adhesive is applied, and said adhesive is applied to said locations with predetermined coating amounts of said adhesive which are gradually reduced as a distance from said center point increases in said adhesive coating step.

19. A manufacturing method of a semiconductor device according to claim 1, wherein a surface of said substrate pads of said substrate is roughened.

20. A manufacturing method of a semiconductor device according to claim 1, wherein dimensional values of said substrate pads of said substrate are measured, and the pushing force of said recess forming step is determined based on said measured dimensional values, so that said substrate is forced in accordance with said determined pushing force.

21. A manufacturing method of a semiconductor device according to claim 2, wherein said bare chip is initially forced onto said substrate by setting said pushing force to a smaller value, and said pushing force is increased to a predetermined value and said bare chip is forced onto said substrate prior to the hardening of said adhesive in said composite step.

22. A manufacturing method of a semiconductor device according to claim 2, wherein a recessed amount corresponding to the recess of said substrate pads in said composite step is measured allowing for a collapsed amount of said bumps, and said bare chip is forced onto said substrate until said recessed amount reaches a predetermined value.

23. A manufacturing method of a semiconductor device according to claim 22, wherein a pushing force is applied to each of said bumps prior to said composite step, whereby a height of each of said bumps prevents deforming.

24. A manufacturing method of a semiconductor device according to claim 22, wherein said bare chip is forced onto said substrate in said composite step while increasing said pushing force by stages in accordance with increases in temperature of said substrate until the recessed amount of said substrate pads reaches a predetermined value.

* * * * *

UNITED STATES PATENT AND TRADEMARK OFFICE
CERTIFICATE OF CORRECTION

PATENT NO. : 5,926,694
DATED : July 20, 1999
INVENTOR(S) : Yasuhide Chigawa, et al.

It is certified that error appears in the above-identified patent and that said Letters Patent is hereby corrected as shown below:

On the title page

Title Page, [57] ABSTRACT, line 9, delete "the", (first occurrence).

Please delete drawings sheet FIG. 23, and substitute drawing sheet FIG. 23 as per attached.

Column 1, line 28, delete "thereafter".

Column 4, line 18, delete "of this invention".

Column 5, line 12, delete "and".

Column 6, line 10, delete "according to this invention".
lines 44 and 45, delete "of this invention".

UNITED STATES PATENT AND TRADEMARK OFFICE
CERTIFICATE OF CORRECTION

PATENT NO. : 5,926,694
DATED : July 20, 1999
INVENTOR(S) : Yasuhide Chigawa, et al.

It is certified that error appears in the above-identified patent and that said Letters Patent is hereby corrected as shown below:

Column 8, line 1, delete "according to the invention".

Column 9, lines 4 and 5, delete "this invention shown in".

Column 11, line 16, after "pad 6" insert --/--.

Column 12, line 3, change "pad6" to --pad 6--;
line 35, delete "of this invention";
line 41, delete "of this invention";

Column 13, line 7, delete "of this invention".

Figure 36B:
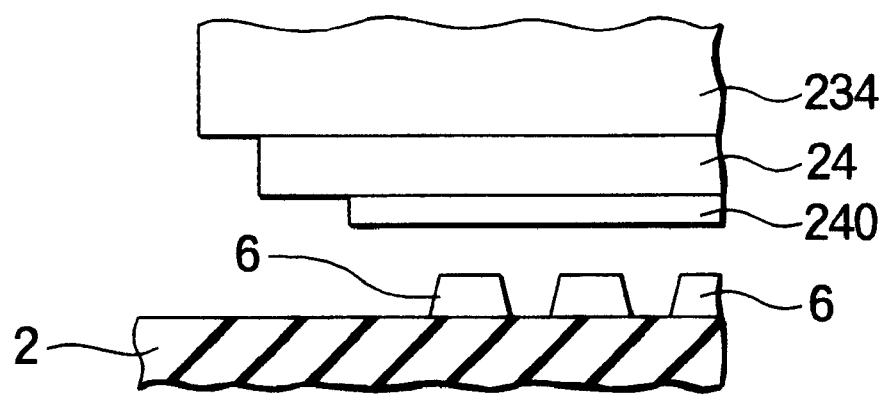

Column 16, line 9, change "Fig. 36D" to --Fig. 36B--.

Signed and Sealed this

Fourteenth Day of December, 1999

Attest:

Q. TODD DICKINSON

Attesting Officer

Acting Commissioner of Patents and Trademarks

RESULT OF PCT (105C 100% 1.2atm 72H)

RESULT OF TCT (-40C to +100C)